United States Patent [19]
Beckwith

[11] Patent Number: 5,544,064
[45] Date of Patent: Aug. 6, 1996

[54] APPARATUS AND METHOD FOR SAMPLING SIGNALS SYNCHRONOUS WITH ANALOG TO DIGITAL CONVERTER

[76] Inventor: Robert W. Beckwith, 2794 Camden Rd., Clearwater, Fla. 34619

[21] Appl. No.: 246,630

[22] Filed: May 20, 1994

[51] Int. Cl.⁶ .................................................. G01R 19/00
[52] U.S. Cl. ........................................ 364/483; 364/487
[58] Field of Search .................................. 364/480–486, 364/494; 395/800; 324/77 R, 74, 78 D; 323/257; 307/31; 341/141; 361/35, 36, 76, 78–87

[56] References Cited

U.S. PATENT DOCUMENTS

| | | | |
|---|---|---|---|
| 4,419,619 | 12/1983 | Jindrick et al. | 323/257 |
| 4,779,044 | 10/1988 | Skolnick et al. | 324/77 R |
| 5,043,911 | 8/1991 | Rashid | 364/494 |
| 5,072,375 | 12/1991 | Takeuchi et al. | 395/800 |
| 5,224,011 | 6/1993 | Yalla et al. | 361/93 |
| 5,315,527 | 5/1994 | Beckwith | 364/483 |

*Primary Examiner*—James P. Trammell
*Attorney, Agent, or Firm*—Leo J. Aubel

[57] ABSTRACT

This invention provides various methods and techniques for providing a synchronous programming of a microcontroller and its associated analog to digital converter for a maximum rate of taking digital samples of alternating current analog signals which techniques are selectively combined to provide microcontroller based controls and protective relays such as for use with electric utilities.

21 Claims, 17 Drawing Sheets

APPARATUS AND METHOD FOR SAMPLING SIGNALS SYNCHRONOUS WITH ANALOG TO DIGITAL CONVERTER

BACKGROUND OF INVENTION

This invention discloses certain improvements to the invention disclosed and claimed in U.S. Pat. No. 5,315,527 issued to Robert W. Beckwith on May 24, 1994 (also the inventor of the present invention) entitled "METHOD AND APPARATUS PROVIDING HALF-CYCLE DIGITIZATION OF A-C SIGNALS BY AN ANALOG-TO-DIGITAL CONVERTER"; said patent being incorporated herein by reference.

U.S. Pat. No. 5,315,527 discloses the digitization of portions of an alternating current (AC) signal of selected polarity for use where all of the information necessary to make desired measurements of the entire signal is contained in a selected portion of the signal. U.S. Pat. No. 5,315,527 discloses certain inventive advantages in the use of a high sampling rate in measuring the amplitude of an AC signal using a charge coupled analog to digital converter (ADC). U.S. Pat. No. 5,315,527 further describes inventive ways of measuring the amplitude of at least two AC signals and the phase angle between them. The measurement of the average and the RMS value of amplitude are disclosed, as well as the measurement of phase angle as the time between zero crossings of the AC signals.

U.S. Pat. No. 5,224,011 issued to Murty V. V. S. Yalla et al. discloses an all-digital device for electric power system protective relaying. In U.S. Pat. No. 5,224,011, control voltage or current signals are sampled by an ADC and the samples processed using Fourier Transforms in order to extract factors required for computation essential to performance of said device. These samples are taken at a rate established by a multi-task operating system used by an associated microprocessor.

U.S. Pat. No. 4,419,619 issued to James A. Jindrick et al., dated Dec. 6, 1983, (Jindrick) describes the use of microprocessor and software modules for the control of a voltage regulating transformer. Jindrick requires transforming digital voltage signals from the time domain into the frequency domain to obtain a measured digital voltage signal representative of the RMS voltage. In contrast to Jindrick, the present invention computes the RMS amplitude of a signal directly in the time domain and does not transform into the frequency domain. The present invention also provides for the alternate computation of the average amplitude of an input AC analog signal, or the computation of the peak value of an input analog signal, all being computed directly in the time domain.

Furthermore, Jindrick requires processing a number of cycles to obtain the RMS value whereas the present invention develops its full measurement resolution on each half cycle sampled. Jindrick requires the use of a software operating system whereas the inventive program requires essentially no operating system. The MERTOS operating system referenced by Jindrick may in itself be as large as the entire program required by the present invention.

Another prior art signal sampling method is to synchronize a specific number of samples with the power frequency thus fixing the number of samples per cycle regardless of slow changes in the power frequency. Such a method is described in an article by Gabriel Benmoual entitled "AN ADAPTIVE SAMPLING-INTERVAL GENERATOR FOR DIGITAL RELAYING" published in IEEE Transactions on Power Delivery, Vol. 4 No. 3 July 1989. In the present invention and in contrast to Benmoual, the signal sampling rate is synchronized with a free running ADC in order to more effectively utilize the sampling rate capability of said ADC.

Most of the foregoing methods require an analog anti-aliasing filter in each AC signal channel ahead of the ADC for the purpose of avoiding alaising or the incorrect assimilation or misinterpretation of harmonic frequency components of said AC signal. The high sampling rate of the present invention eliminates the necessity for anti-alaising filters and, furthermore, improves the amplitude measurement accuracy of a single AC signal cycle as will be described hereinafter.

Furthermore, much of the hardware, software and operating time in equipment typified by the patents and articles listed above is used in data processing and communications resulting in added cost and reduced efficiency in the fundamental task of control or protection.

The present invention provides alternative communications having higher data rates than usable over a telephone circuit, and passes the data processing and communications work to a personal computer that is only required when such data processing and communications are desired. Only a very few percent of the inventive hardware, software and operating time is used in serving this external computer.

Furthermore, controls and protective relays, as described above, devote much hardware, software, and operating time in providing an operator interface which may often be used for only brief periods in a years time. Inventive ways of using said personal computer (PC) for the operator interface are described hereinunder whereby said PC need only be connected when required as an interface.

SUMMARY OF INVENTION

The present invention discloses inventive apparatus and methods for using a microcontroller having a central processor unit (CPU) and an ADC wherein a processor program is synchronized with the operation of the ADC so as to maximize the rate of sampling of a plurality of AC input signals.

The present invention also uses a linear program, herein defined as one in which computational tasks are completed one at a time in contrast to a multitask operating system wherein a number of tasks are scanned with a set amount of time allocated to each task on each scan.

The present invention is illustrated using a microcontroller in apparatus for the control or protective relaying of equipment for the generation, transmission and distribution of electric power.

The present invention, is related to U.S. Pat. No. 5,315,527 cited above. The present invention discloses inventive methods and techniques which may be combined to form various products. Inventive synchronous and linear subprograms run one at a time with an entry and an exit point for easy linking in a modular manner to provide a complete product. Apparatus using these inventive methods of programming is termed herein as a "Synchronous Linear Machine" (SLIM). The inventive methods enable program subroutines of reduced size which are easily linked together into a complete program. The inventive techniques disclosed herein, result in products of high efficiency and low cost and are improvements over prior art modular construction. Three examples of such combination are given, one for a tapchanging transformer control, one for a volts-per-hertz (E/Hz)

protective relay and one for a single phase differential current protective relay.

The present application also describes apparatus and methods for reducing the frequency error caused by the finite period of the digital samples in determining the actual zero crossings of the analog signals. This error reduction is utilized herein for measuring the maximum E/Hz of a three phase AC signal as well as for measuring frequency of an AC signal.

Improved resolution and accuracy of voltage and current amplitude and relative phase measurement are made possible by the high sampling rate, as will be disclosed.

Non-synchronous computation and control subroutines, using the data generated by the synchronous measurement subroutines are done linearly, or one at a time, thereby simplifying the program structure and minimizing the memory space required to contain the program. Data is sent and received in short, high frequency bursts, to and from an external personal computer (PC). This PC can also be used as a Network Interface Module (NIM) to connect to a Local Area Network (LAN). The data exchange with a NIM, the synchronous measurement subroutines, and the linear computation and control subroutines may be combined, one after the other, forming an overall program loop (See FIG. 6, for example.) that cycles continuously until an operation, such as for example a tapchange in a tapchanging transformer control, is called for. No program interrupts are used other than on the time out of a watch dog timer.

The PC is also used as the man-machine interface (MMI) for the interconnected device which otherwise has a limited number of displays such as LED's to indicate normal operation. This reduces the size of the operating program required for said device; and, in addition, only a very small subroutine is required for the device to send the communication bursts.

The foregoing features and advantages of the present invention will be apparent from the following more particular description of the invention. The accompanying drawings, listed hereinbelow, are useful in explaining the invention.

DESCRIPTION OF THE DRAWINGS

FIGS. 1(a)–1(g) show time lines useful to explain synchronous programming.

FIGS. 18-1, 18-2(a) and 18-2(b) show synchronous program diagrams for a single phase differential relay.

DESCRIPTION OF INVENTION

Definitions of Variables

The following variables, as defined below, are used in the specifications and claims:

t—ADC conversion time in clock cycles, (a tik)

Pt—ADC conversion time in seconds r—clock cycles intervals between result register updates r'—clock cycles a result register read lags a result register update x—the number of tiks a result is held in a result register before being updated; note therefore that r=x*t n—the length of a program loop in tiks m—the length of a program step in tiks

CHOICE OF MICROCONTROLLER

Control and protective relay devices are used for control and protection of equipment for generation, transmission and distribution of electric power. These devices are used in various parts of the world and the devices must operate properly over a temperature range from −40 to +80 degrees celsius to assure proper operation under extreme temperature conditions. Furthermore, said relay devices are subject to high electric and magnetic disturbances. These may stem from lightning strikes, from the opening of high voltage disconnect switches, and many other sources of high energy, high frequency emanations. Also it is traditional in the electric utility industry to expect long equipment life of 20 years or more.

Microcontroller devices are now used in control and protective circuitry in electric utility applications. In view of the demanding requirements of such utility applications it is desirable to use a microcontroller using level sensitive (static) logic as compared to edge triggered logic. The microcontroller may, therefore operate at relatively low clock speeds. The microcontroller should be transient protected at all inputs and outputs and relatively insensitive to misoperation due to all forms of electromagnetic radiation from 60 hertz up to cosmic rays.

Figure 4:
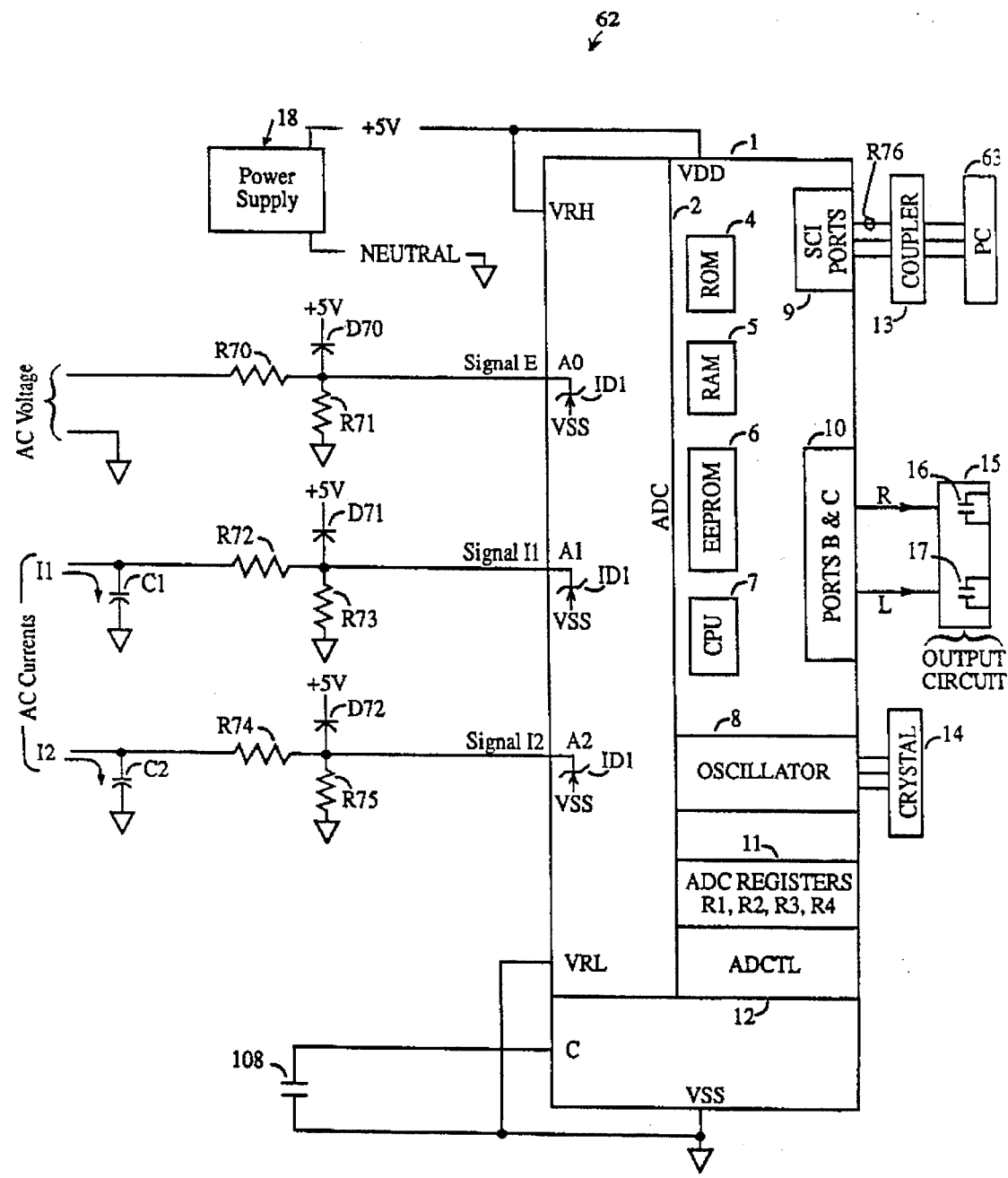
FIG. 4 is a circuit diagram showing signal inputs to, and outputs from, a microcontroller as useful in applying the inventive synchronous linear machine to a tapchanger control.
Figure 11:
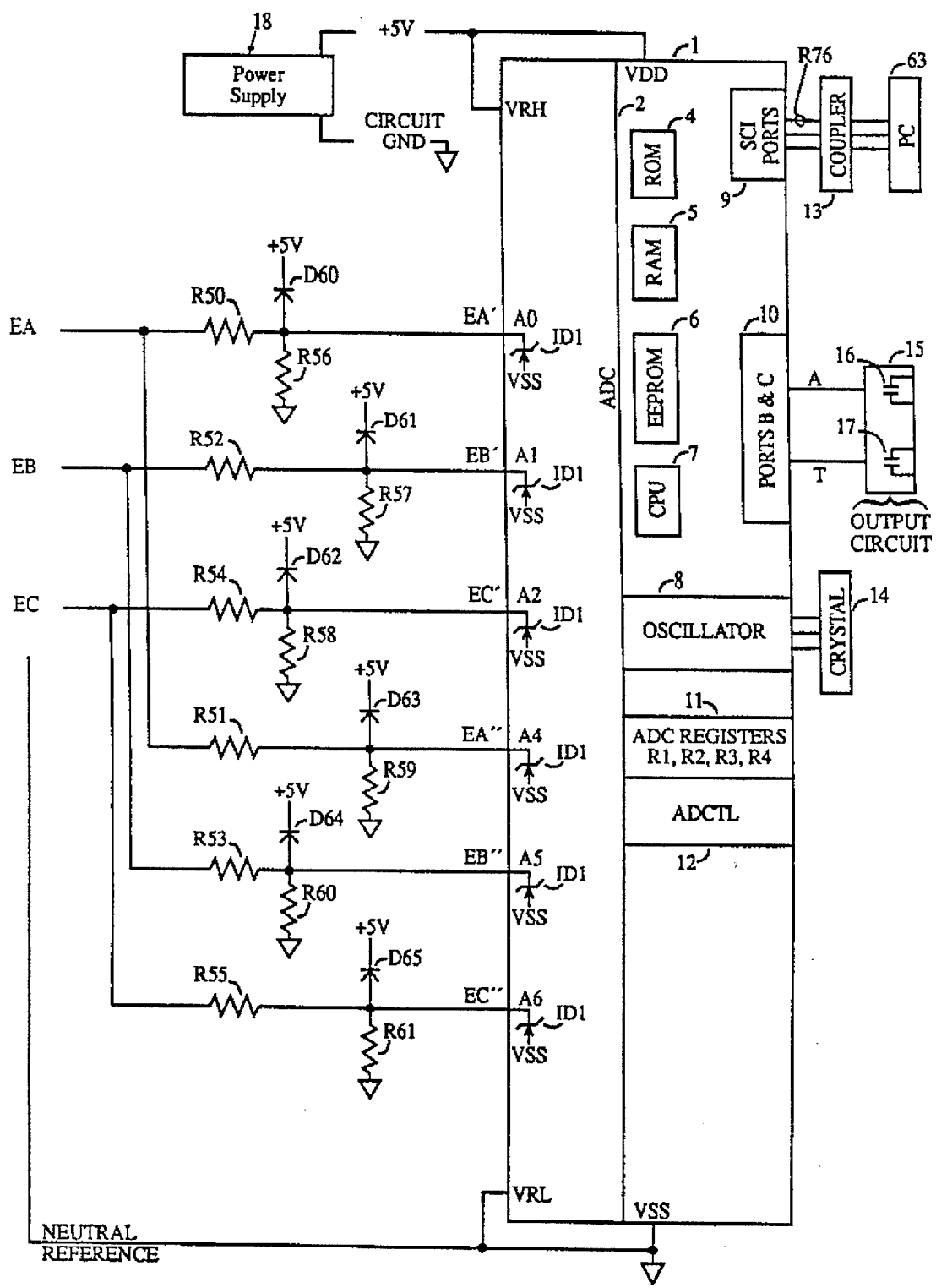
FIG. 11 is a circuit diagram showing signal inputs to an ADC as useful in applying SLIM to a volts-per-hertz relay.
Figure 15:
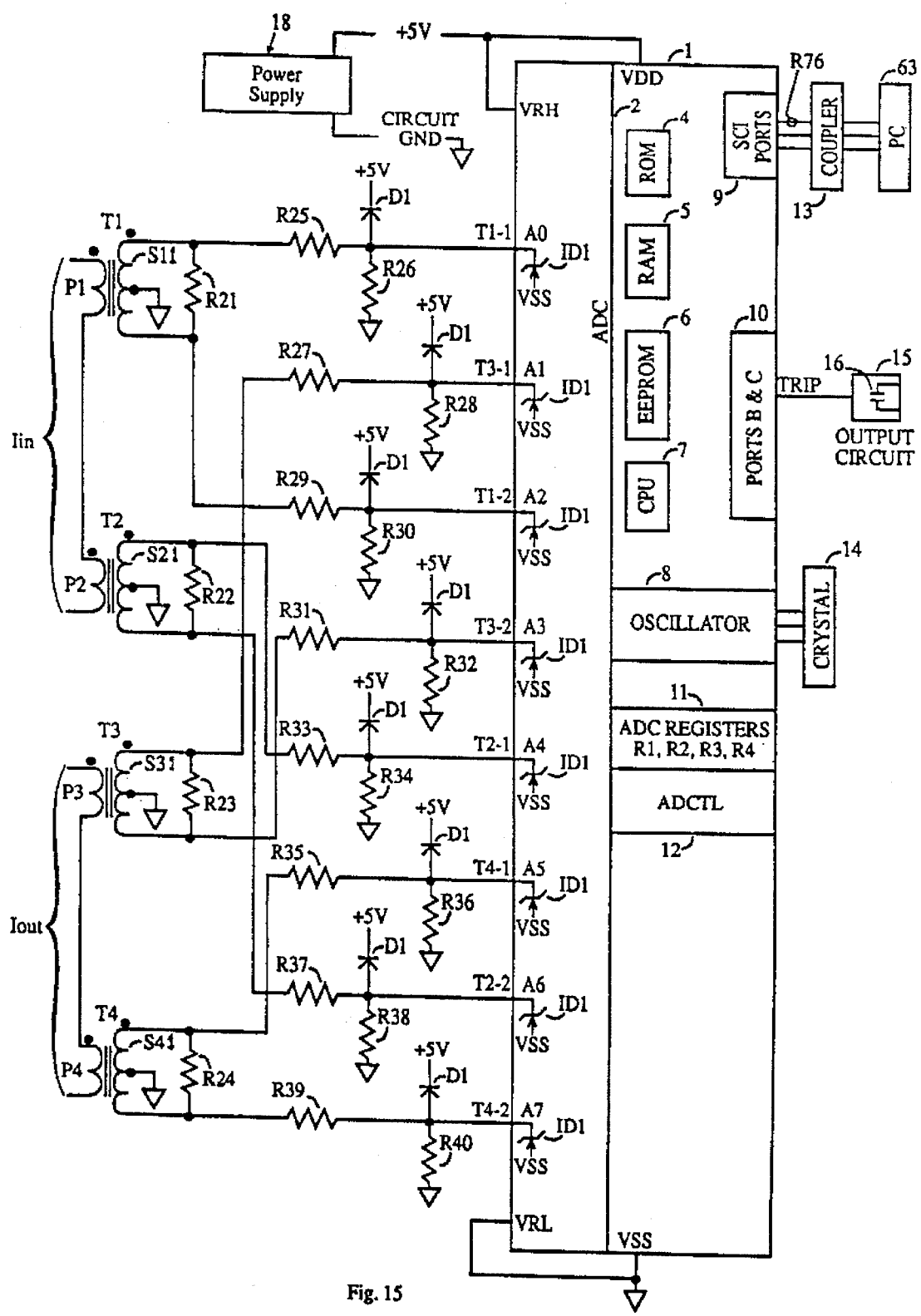
FIG. 15 is a circuit diagram showing signal inputs to, and outputs from, a microcontroller as useful in applying SLIM to a single phase differential relay.

The microcontroller 1 as shown in FIGS. 4, 11, and 15, utilized in preferred embodiments of the invention, is a Motorola MC68HC11E9 (HC11) which is a single chip device and which is readily available at present; however, other microcontrollers with similar characteristics could be used in the present invention and the invention is not limited to the use of a specific microcontroller. References to the HC11 relate to the 68HC11 as described in Motorola HCII REFERENCE MANUAL M68HC11RM/AD REV 1, 1990. The HC11 is available with 12K of EPROM 4, used for storage of programs described herein, has 512 bytes of RAM 5, used by the CPU 7 for scratch pad memory, and 512 bytes of EEPROM 6, used as non-volatile storage of setpoints and other data which must be maintained upon loss of power. The HC11 has a system clock frequency of 2 mhz, or less, operated by oscillator 8 using crystal 14 operating at four times the system clock frequency. The HC11 also includes an ADC 2 which is connected and configured to operate from the same system clock from oscillator 8 as the CPU 7 to provide the inventive synchronous operation.

As stated above, the number of clock cycles "t" for any ADC to make a conversion is hereinafter called a "tik". In some microcontrollers "t" is fixed, in others, "t" is settable.

Referring to FIG. 4, in the microcontroller 1, the ADC 2 performs an analog to digital conversion in one tik, with the result being transferred into the result registers 11 in a part of the clock cycle. The results in the registers are read at times when results are not being entered, therefore no interference occurs between reads and result updates.

As alluded to above, the present invention may also utilize other controllers with a more flexible ADC control matrix such as a Motorola MC68HC16 microcontroller. Reference herein to the HC16 relates to the MC68HC16Z2 as described in Motorola M68HC16 USERS MANUAL MC68HC16Z2UM/AD. The Motorola MC68HC16 microcontroller (HC16) is a 16 bit device which is of the same family as the HC11 microcontroller. The HC16 microcontroller has a very flexible ADC control matrix shown as the Mode and Timing Control of FIG. 3d), which permits a program to set the ADC conversion period to any predetermined number of clock cycles from 16 to 32 and also permits coupling up 8 analog inputs to 8 output registers for continuous scanning in a choice of 8 or 10 bit resolution. It is possible to set the ADC control in a program independent manner and accommodate a wide variety of synchronous programs using the inventive means and methods, including the possibility of scanning some inputs more often than others. In general, any result register 0 . . . 7 of FIG. 3d) can be set so as to be updated at integral multiples of said predetermined conversion period.

FIG. 3(a) illustrates use of the ADC 20 of an HC16. FIG. 3(d) depicts the ADC 20 portion programmed to digitize 8 inputs, A0 through AN, associated with registers 21 labeled R0 through R7 and using a program loop from 16 to 32 clock cycles long. In ADC 20 the sampling time can be set from 16 to 32 clock cycles permitting the program loop to be written as short as possible (down to 16 clock cycles). The ADC 20 can then, in general, be set to match the number of clock cycles in a program rather than requiring the program loop to be written with do-nothing cycles to match the ADC 2, as with the HC11; as will be described hereinafter. FIG. 3(b) illustrates a program loop two tiks long, and FIG. 3(c) illustrates a program loop three tiks long.

As will become apparent, the inventive apparatus and methods are equally applicable to microcontrollers having generally similar capabilities as the HC11 or HC16.

SYNCHRONOUS PROGRAMMING

Referring again to FIG. 4, the present invention discloses an apparatus including a microcontroller 1 operating selectively in a synchronous mode and a linear mode, and methods of selectively utilizing the apparatus in synchronous modes and in linear modes. The ADC 2 has an associated control register (ADCTL) 12 having scan control bits, result register control bits and input channel select bits. AC signals connected to the ADC 2 are sampled by the ADC 2 running in a continuous sampling mode as set, using said scan control bits. A program then runs bit synchronous with said ADC 2 thus minimizing the need for ongoing program commands from the program to said ADC 2.

Figure 1:
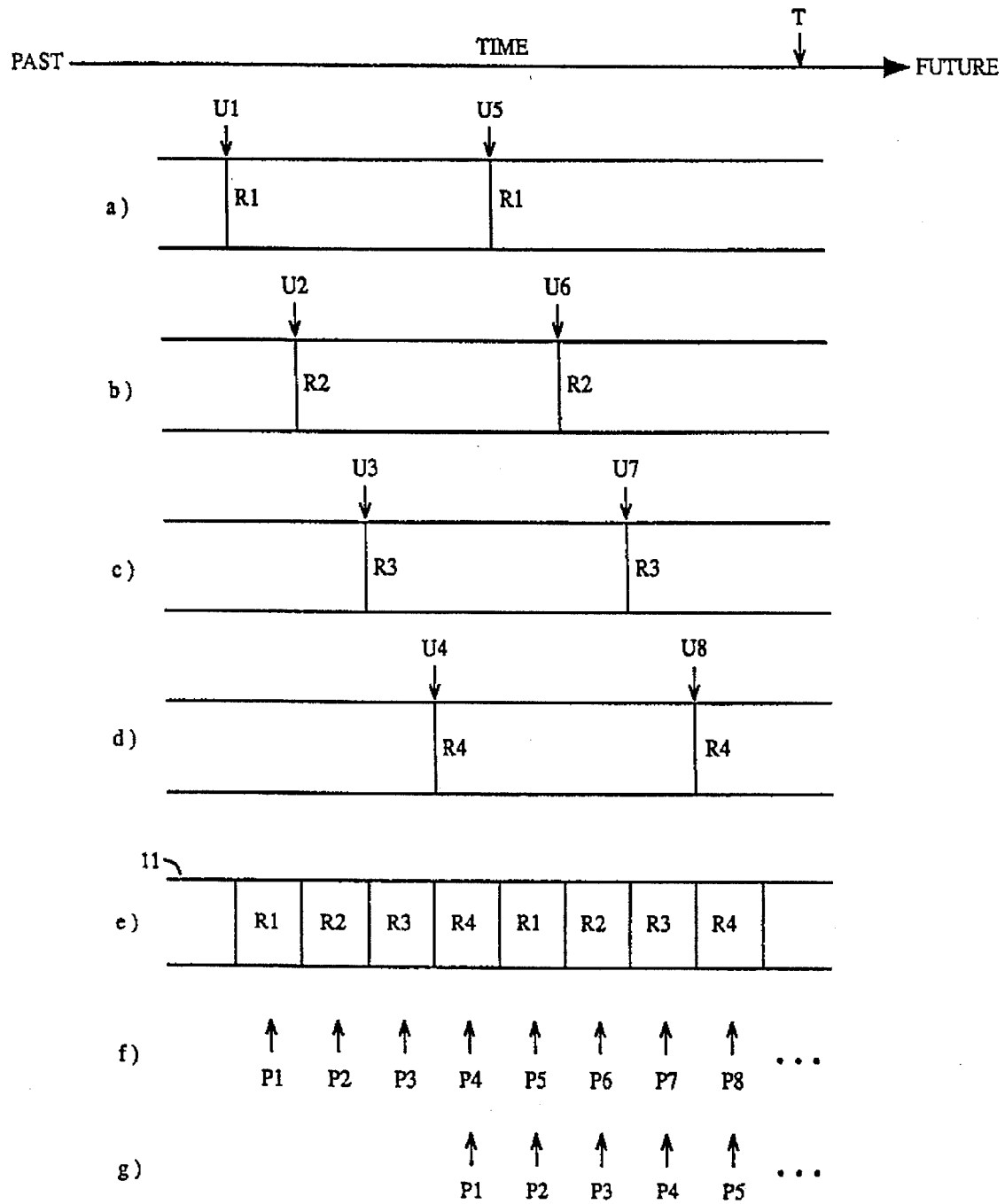
Figure 2:
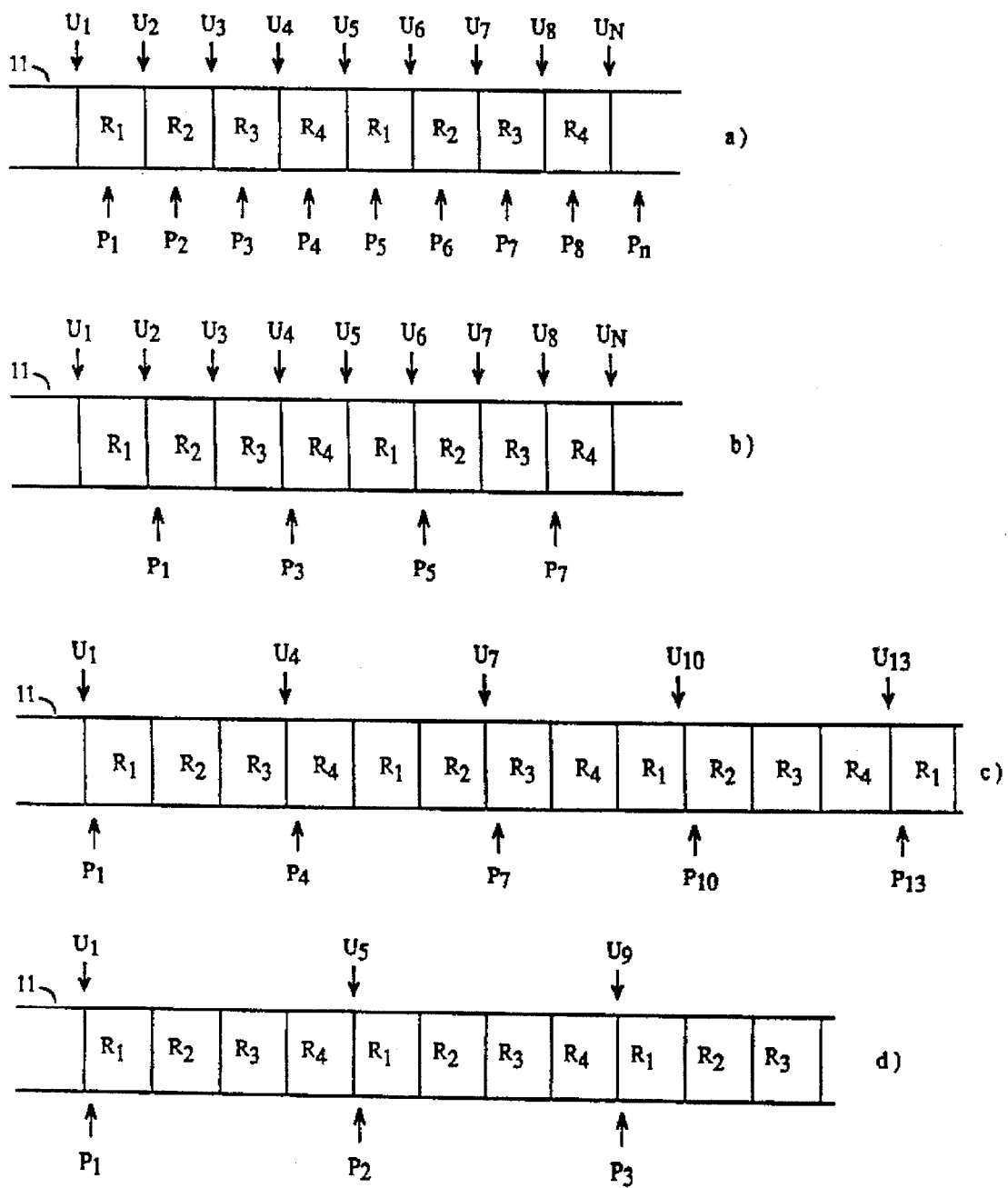
FIGS. 2(a)–2(d) show time lines useful to explain synchronous programming using a microcontroller such as the Motorola MC68HC11 with program loops varying in integral multiples of one tik in operating time.
Figure 3:
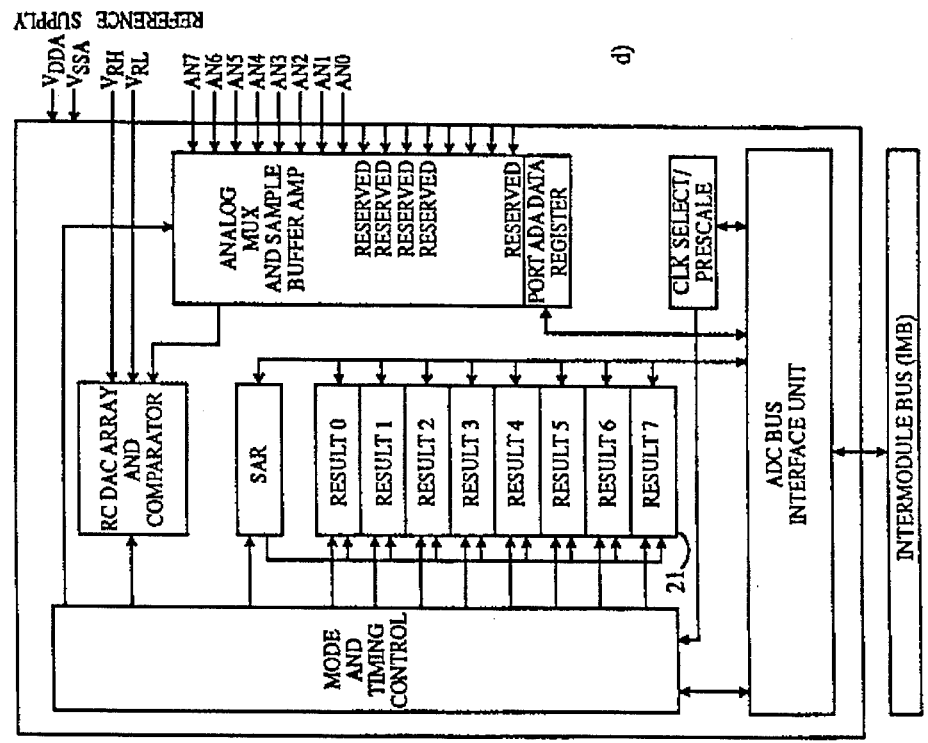
FIGS. 3(a), (b), and (c) show time lines useful to explain synchronous programming using a microcontroller such as the Motorola MC68HC16.
FIG. 3d) shows a block diagram of the ADC system portion of the HC16 microcontroller.
Figure 3:
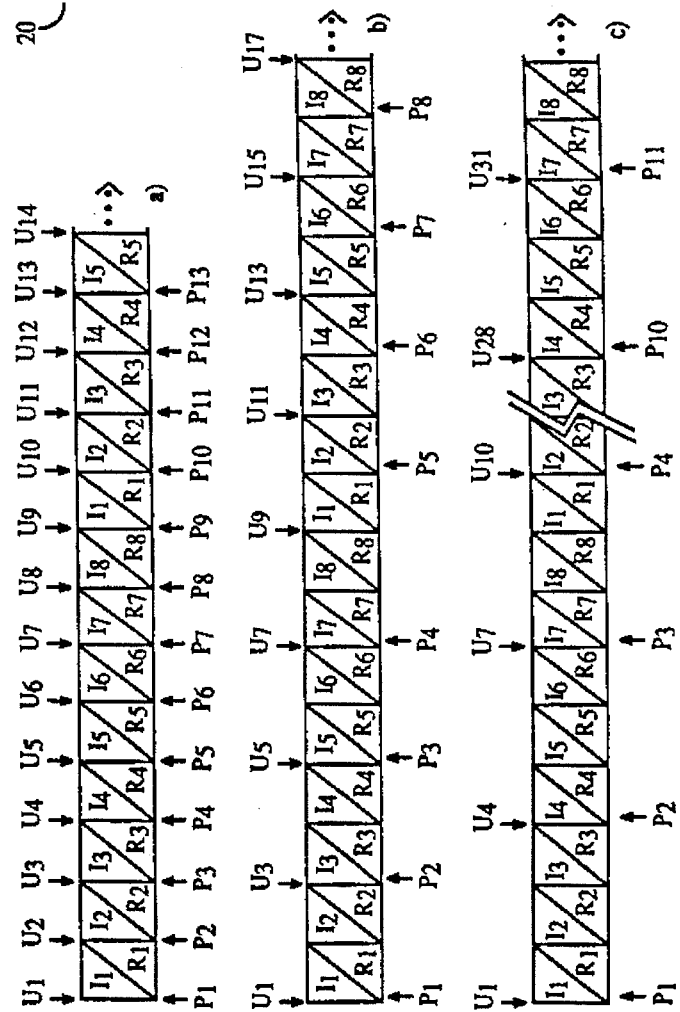

FIGS. 1, 2 and 3 illustrate the programming techniques required to achieve synchronous operation using an HC11. While, in general, ADC's inputs may be sampled at any integral "x" multiple of their analog to digital conversion time, in the HC11 there is a choice for the integer between one or four. The HC11 has a predetermined conversion period "t" fixed at 32 clock cycles and has a relatively restricted set of instructions for ADC 2 which permit two alternative modes of operation of ADC 2. A first alternative mode (A) of operating ADC 2, is obtained by setting said result register control bits for continuous sampling of an input channel selected by said input channel select bits and with results being stored, round robin fashion, in four result registers, R1 . . . R4. "Round robin" as referred to in the Motorola reference manual is best shown in FIG. 1(f), where a succession of program steps, P1 through P8 read result registers 11 in the repeating fashion of FIG. (e). The second alternative mode (B) of operating the ADC 2 is obtained by setting said result register control bits to selectively sample either the first four or the second four input channels, said selection obtained by setting of the input channel select bits, such as to sample said four analog input signals, in round robin fashion, with results being stored in four corresponding result registers, R1 . . . R4.

For synchronous operation, and as mentioned above, in the present invention the ADC 2 is connected and configured to operate from the same system clock as CPU 7.

The upper limit of the HC11 frequency, and the frequency used in the following explanations, is provided by oscillator 8 at 8 mhz as established by crystal 14, but since a 4 phase clock is used, the clock rate has an upper limit of 2 mhz. The CPU 7 program uses only one of the oscillator 8 phases, and the ADC 2 updates the result registers on the other phases. The ADC 2 updating of one of the result register 11 and program reading of a register thus cannot interfere with each other.

The synchronous measurement methods of the invention will now be described. In general, the method provides for reading result register 11 samples every selected integral number "m" tiks. The methods can best be explained with three time vectors as shown in FIG. 1. The first is the pointer "T" which is real time. A second time pointer, "U", describes the updating of result registers, R1, R2, R3, and R4 by a free running ADC 2. The third time vector "P" represents the time at which the synchronous program reads the result registers 11. Vector P lags the registers 11 update by a time which may be determined by chance when the synchronous program starts. The lag time "r"', in clock cycles remains constant until the synchronous program ends.

Note that FIG. 1 is a one dimensional display of time lines in the horizontal direction with time events within boxes or indicated by pointers. FIG. 1(a) depicts an ADC 2 result register R1 updated at a time U1 and held for a time period represented by the box labeled R1; FIG. 1(b) shows register R2 updated at time U2, one tik after register R1. FIG. 1(c) illustrates an ADC 2 result register R3 updated at time U3, two tiks after register R1; and FIG. 1(d) illustrates an ADC 2 result register R4 updated at time U4, three tiks after register R1. With the ADC 2 configured for free running, FIGS. (a), (b), (c), and (d) each depict the respective registers R1, R2, R3, R4 holding a result for four tiks after which they are again updated.

In FIGS. 1(e), FIGS. 1(a), (b), (c), and (d) are combined with the register time periods superposed on a single time line with only the first tik from FIGS. 1(a), (b), (c), or (d) being indicated.

Figure 7:
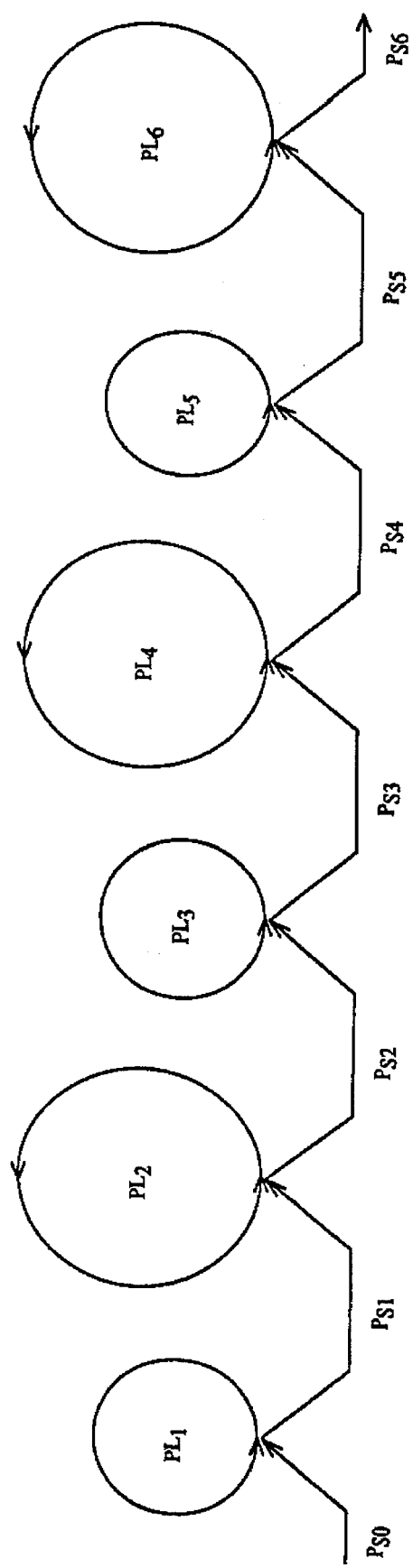
FIG. 7 is a flow chart of the SLIM measurement program used for a tapchanger control.

In FIG. 1(f), assuming use of the HC11, the program running time vectors, shown as arrowed lines, P1, P2, ... P8 show the times of reading of the respective registers by a program loop set to take exactly 32 clock cycles per turn of the program loop. Program loops PL1, PL3 and PL5 of FIG. 7 are typical 32 clock cycle loops with FIG. 7 illustrating their use to detect zero crossings of an alternating current (AC) signal and entering the results in respective result registers as will be described more fully hereinbelow.

The program time pointers or arrows P1 ... P8 of FIG. 1(f), may be moved forward or backward to any clock cycle whatsoever with the only difference being the time the program data reads lag behind real time. In other words, the registers R1, R2, R3, and R4 hold the data 4 times 32=128 clock cycles and the program data may lag behind real time from one to 128 clock cycles depending on when the program happens to start with relation to the ADC 2 cycle of register updating. The synchronous program can start on any one of the 32 clock cycles within any tik and thereafter will not deviate from that particular clock cycle within subsequent tiks until the synchronous sub program is completed.

Note also that the program may start with any register. FIG. 1(g) depicts an example of starting with register R4. In the structure depicted in FIG. 1 the registers R1, R2, R3, and R4 contain samples from one analog input in accordance with a first mode of operating the ADC 2. However, as stated above, the ADC 2 is also operable by storing four signals in corresponding registers.

Depending on the task required for a synchronous program step or program loop, it may be necessary for the program step or program loop time to be greater than one tik. This invention provides program steps or program loops of varying integral number "m" or "n", respectively, of tiks in operating time as described below so that they will each run synchronously with the ADC 2. Thus a synchronous program step or program loop must have all operations whose operating time is data independent and, if necessary, include fixed time do-nothing steps to round off the operating time to an integral multiple of tiks.

FIG. 2, continuing to assume use of the HC11, illustrates synchronous programming with several combinations of program loops from one to four tiks in length and using both modes of ADC 2. As stated above, one embodiment of the present invention provides a program that samples registers during each program loop with the loop operating in 32 clock cycles, or one tik, thus obtaining data from each result register R1, R2, R3, R4 in the order 1, 2, 3, 4, 1, 2, ... etc. as depicted by FIG. 2(a). The use of ADC 2 in said first mode provides a sampling rate of one sample per tik. FIG. 2(a) depicts an ADC 2 time vector U updating result registers R1, R2, R3, and R4 in round robin fashion at times U1, U2, ... UN. A synchronous program vector P is depicted in FIG. 2(a) for a program loop one tik long. Vector P illustrates a program loop one tik long sampling the result registers R1, R2, R3, and R4 in round robin fashion at times P1, P2, ... Pn. The sampling will occur at some clock cycle of the program loop at the programmers choice, it making no difference which one. This synchronous feature reduces the program complexity, permitting useful program loops to be only one or two tiks in length, and in turn this increases the frequency of sampling. Thus the inventive apparatus and methods of the invention achieve the high sampling rate that is required to achieve the averaging of ADC 2 errors disclosed by the previously mentioned U.S. Pat. No. 5,315,527.

As also depicted by FIG. 2(a), if said second mode of operation of the ADC 2 is selected and thereby four signal channels are assigned, one to each register, each input is sampled every four tiks with the program reading the result registers in the order R1, R2, R3, R4, R1, ... etc.

FIG. 2(b) depicts the use of a program with a length of 2 tiks. Using the first mode of operating ADC 2, a single signal is scanned into all four registers, and the program alternates in reading registers R2 and R4 to pick up every other signal sample; that is, one every two tiks. Alternatively registers R1 and R3 could be read cyclicly with the same result.

FIG. 2(c) depicts the order of sampling of the registers 11 for a program loop length of three tiks. FIG. 2(c) illustrates the use of the first mode of ADC 2 providing a single input to all four result registers R1, R2, R3, R4 with a sample every three tiks. FIG. 2(c) also depicts the use of the second ADC 2 mode providing four signal inputs to four corresponding result registers R1, R2, R3, R4, with each input being sampled every twelve tiks.

FIG. 2(d), continuing to assume use of the HC11, depicts the order of reading of the registers for a program loop length of four tiks. When the first mode A of ADC 2 is used and a sample of a single signal every four tiks is provided, the program reads one of result registers R1, R2, R3, or R4, the choice being arbitrary. The arrows marked U1, U4, U7, U10, U13 show the ADC updating result register R1 every four tiks. The arrows marked P1, P4, P7, P10, P13 shows said four tik program loop taking samples of result register R1 every four tiks, just after the updates by the ADC. It is clear from FIG. 2(d) that any of the four result registers R1, R2, R3, or R4 could have been chosen and that the lag time "r"' could be any one of 128 clock cycles during which the contents of the chosen result register remains unchanged.

When the second mode B of ADC 2 is used and samples of four signal inputs to four corresponding registers R1, R2, R3, R4 are provided, said four bit program loop reads, in round robin order, R1, R2, R3, R4, obtaining a sample of each signal input every sixteen tiks.

For using of this inventive method using an HC11 with from five to eight ADC 2 inputs, mode B is used with the result register control bits set to input the first four ADC 2 analog inputs. After the first four ADC 2 inputs have been read by the synchronous program, the program switches the result register control bits to input the second four analog inputs. The program then continues to alternate between the first four and the last four ADC 2 analog inputs.

APPLICATION PROGRAM LIBRARIES

Communications, computations and controls using the synchronously measured data generated by the ADC 2 of HC11 are done linearly, that is, one at a time, thereby simplifying the program structure and minimizing the memory space required to contain the program. In one form of the invention, the linear sub-programs are written to run in a data independent fixed number of clock cycles. This enables the calculation of the run time of a one program loop consisting of synchronous measurement, linear computation and control and communications. As this loop is used for control or protective relay purposes, an operations timer is updated, thus the program run time becomes the timer without the use of program interrupts. Alternative methods of measuring time, for example using timers on board the MCU may be used.

Controls and protective relays used for electric utilities generally require one or more voltage and current measurements and since there is a limited number of ways to make these measurements, a library of synchronous measurement subroutines is formed. These measurement subroutines as well as other linear computations address only one task at a time and have a single entry point and a single or at most a limited number of branching exit points. Once a library of such sub-routines is formed, the modular linkage into programs for various devices may be obtained.

The inventive principles of synchronous measurement and linear programming are further clarified in the following examples of their application.

APPLICATION AS A TAPCHANGER CONTROL

An analog type of tapchanger control is described in U.S. Pat. No. 3,721,894 issued to R. W. Beckwith, the inventor hereof. Inventive programming methods are illustrated hereinafter permitting replacement of said analog type of tapchanger with an improved digital form using the inventive concepts.

A digital tapchanger control is described in U.S. patent application Ser. No. 08/152,001, filed Nov. 9, 1993 for Microcontroller-Based Tap-Changer Controller Employing Half-Wave Digitization Of A. C. Signals, filed in the name of Murty V. V. S. Yalla et al wherein R. W. Beckwith is named as one of the co-inventors.

In this example, the positive half cycles of AC voltage signal E and AC current signals I1 and I2 are digitized and the negative half cycles suppressed to zero as described in detail in U.S. Pat. No. 5,315,527 referenced above.

Figure 5:
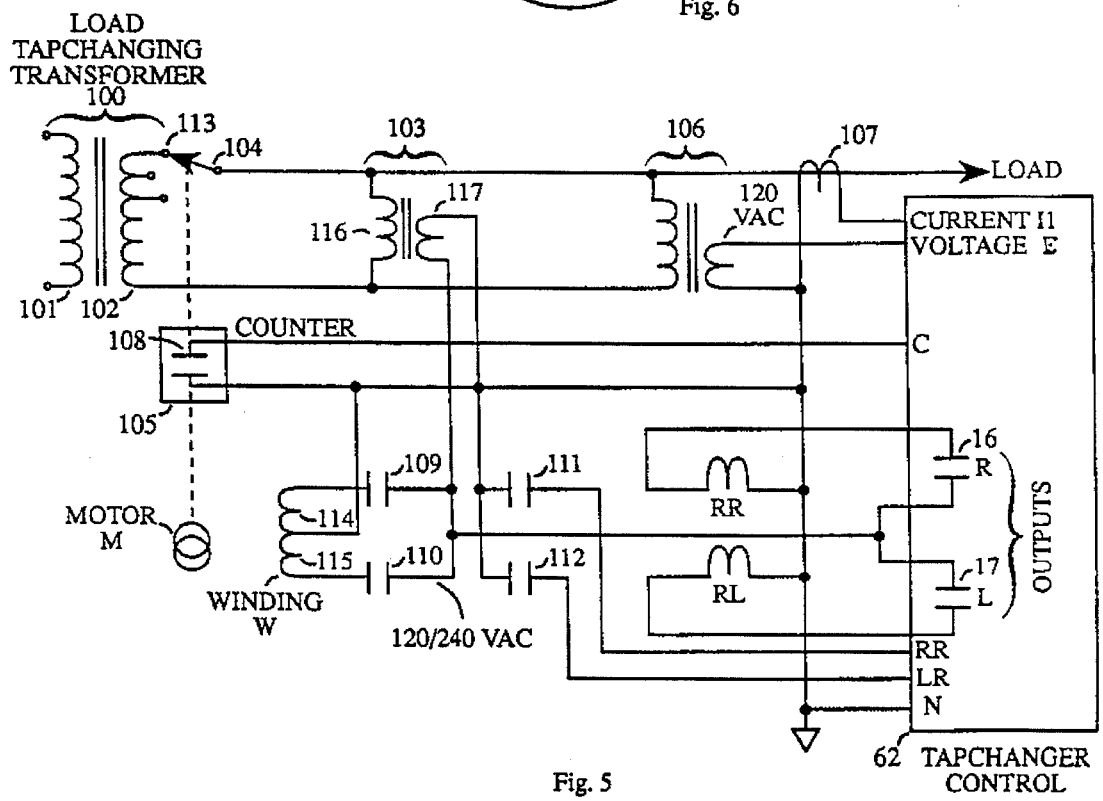
FIG. 5 shows a load tapchanging transformer with tap switch, tap switch driving motor and motor control together with a tapchanger control.
Figure 9:
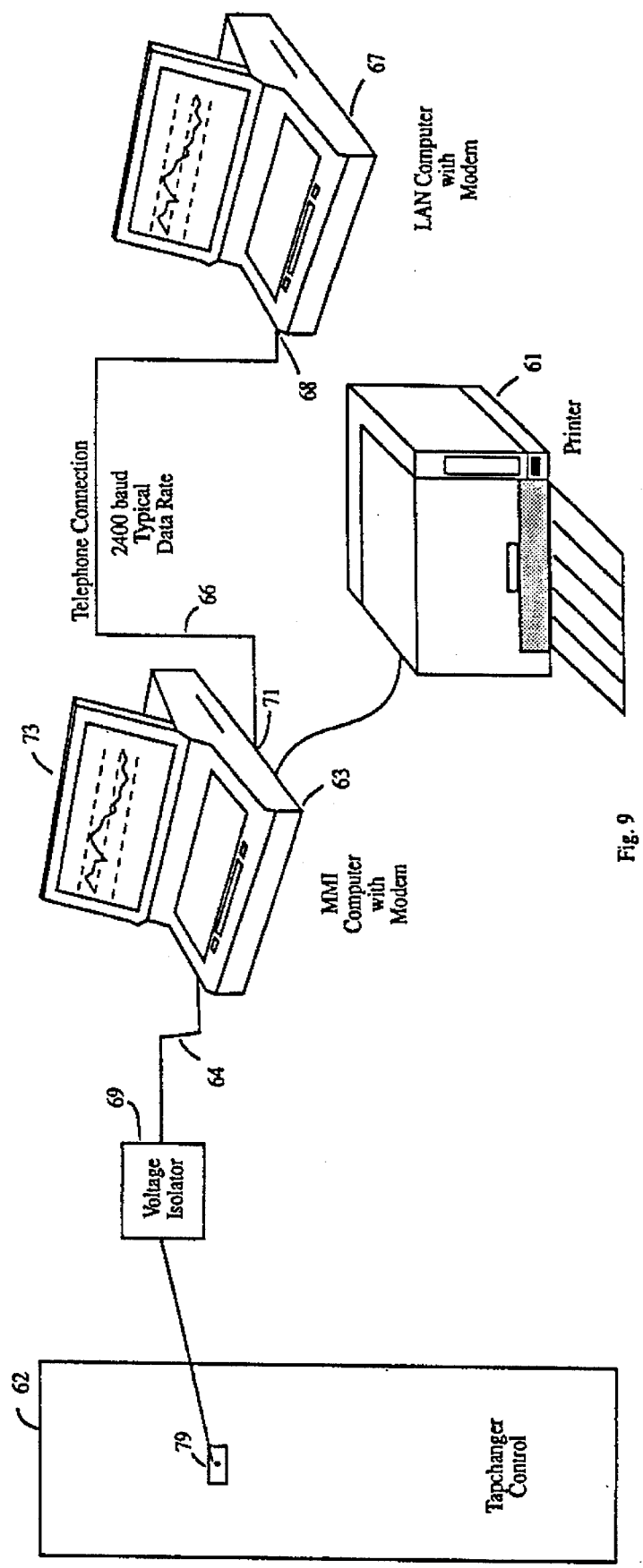
FIG. 9 shows a data readout system for providing a SLIM output to a PC serving both as a MMI and as a NIM coupled to a second computer as an entry point to a LAN.
Figure 10:
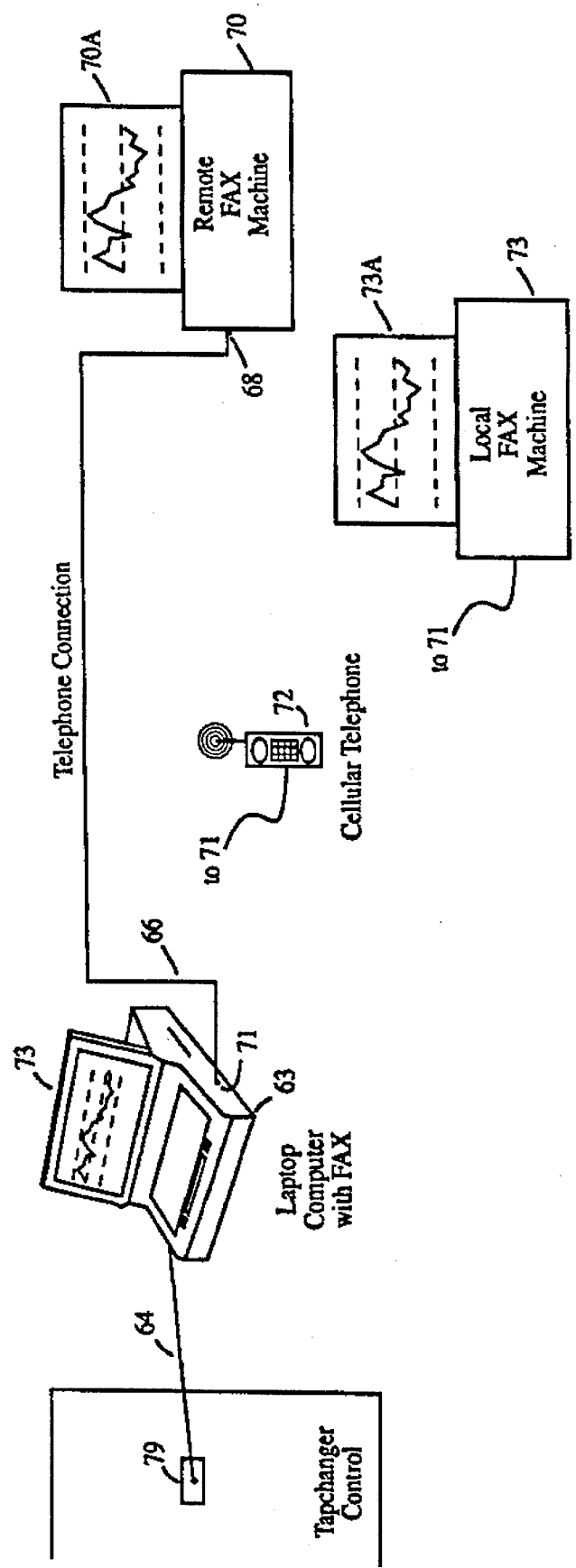
FIG. 10 shows a data readout system for providing a SLIM output through a personal computer to a remote facsimile unit via telephone connections.

FIG. 4 is a circuit diagram of a tapchanger control showing signal inputs E, I1 and I2 to an ADC 2 of microcontroller 1 of the tapchanger control 62. Tapchanger control 62 is also shown in FIGS. 5, 9 and 10. One input is an AC voltage with a nominal voltage of 120 volts and with an upper limit of 140 volts. Resistors R70 and R71 scale said upper limit voltage, producing a signal E connected to ADC 2 input A0, so that the peak of signal E will not saturate the ADC 2. A second input is current I1 which produces a voltage across burden capacitor C1, which voltage is scaled by resistors R72 and R73 producing signal I1 connected to ADC 2 input A1, so that the peak of signal I1 will not saturate the ADC 2 with in a linear range required for current I1. A third input is current I2 which produces a voltage across burden capacitor C2, which voltage is scaled by resistors R74 and R75 producing signal I2 connected to ADC 2 input A2, so that the peak of signal I2 will not saturate the ADC 2 within a linear range required for current I2. Protective diodes D70, D71, and D72 limit the positive excursion of voltage into the ADC 2 inputs while the protective diodes ID1 contained in an HC11 protect the ADC 2 inputs from negative excursion of signal voltages. The signal current into all said protective diodes is safely limited by resistors R70, R72, and R74. The ADC 2 high voltage reference, VRH, is connected to +5 volts dc and the ADC 2 low voltage reference, VRL, is connected to ground. A conventional power supply 18 supplies 5 volts dc to microcontroller 1.

FIG. 5 shows a load tapchanging transformer 100 having a primary winding 101 and a tapped secondary winding 102. A tapchanging motor power supply transformer 103 has a primary 116 connected to the regulated voltage produced by the tapchanging operation in selecting taps 113. The secondary 117 drives the tapchanging motor M via winding W. Said winding W has a 'raise' portion 114 and a 'lower' portion 115. Transformer 106 produces a nominal 120 Vac sensing voltage for tapchanger control 62 and current transformer 107 senses transformer 100 load current for tapchanger control 62. When the tapchanger control 62 operations timer LC (note sub-program 42 of FIG. 6) times out, the tapchanger control closes either a 'raise' contact R (16) or a 'lower' contact L (17), operating motor starter RR, raise, or RL, lower. Said starter RR and RL cause motor run contacts 109 and 110 respectively to close, causing the tapchanger motor to run in the indicated direction and driving tapchanger switch 104 to effect either an increase (raise) or decrease (lower) of the tap position 113. The tapchanging operating mechanism 105 may take from, say 0.4 seconds to 4.0 seconds to make the tapchange, depending on the particular switch characteristic. Counter contact 108 included in motor drive mechanism 105 closes momentarily indicating that said tapswitch 104 change is complete. Contact 111 is a part of motor starter RR and closes indicating that a 'raise' is being performed by motor M. Likewise contact 112 closes to indicate that a 'lower' is being performed by motor M. These contacts respectively provide inputs RR and LR to tapchanger control 62.

Tapchanger control 62 is an example of a synchronous linear machine (SLIM) and is further included in FIGS. 9 and 10 illustrating communications connections to a SLIM.

SYNCHRONOUS MEASUREMENT SUB-PROGRAM

Figure 6:
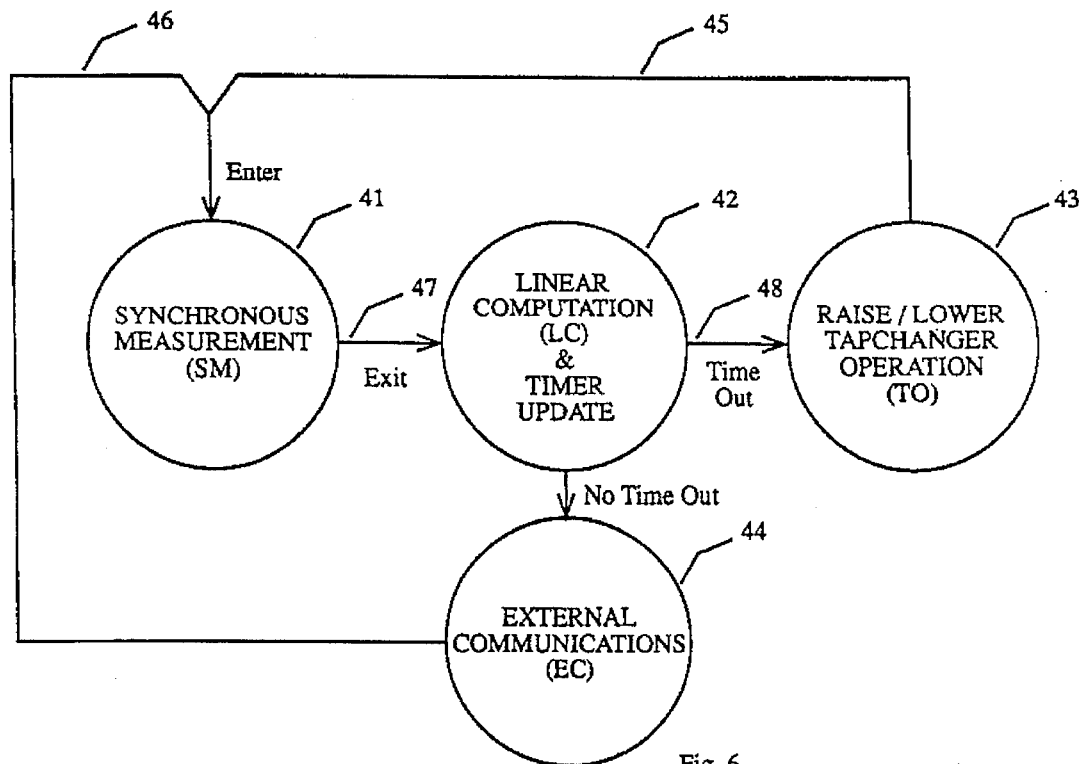
FIG. 6 is a flow chart for the SLIM measurement and control program for a tapchanger control.

FIG. 6 illustrates an overall program flow diagram for a tapchanger control 62. The synchronous measurement sub-program (SM) flow diagram is as described in FIG. 7. While this sub-program is running, all other operations are blocked and interrupts are not used except in the watchdog timer, not shown, which is continuously reset by a properly running program. The SM sub-program ordinarily has but one entry and one exit point.

Figure 8:
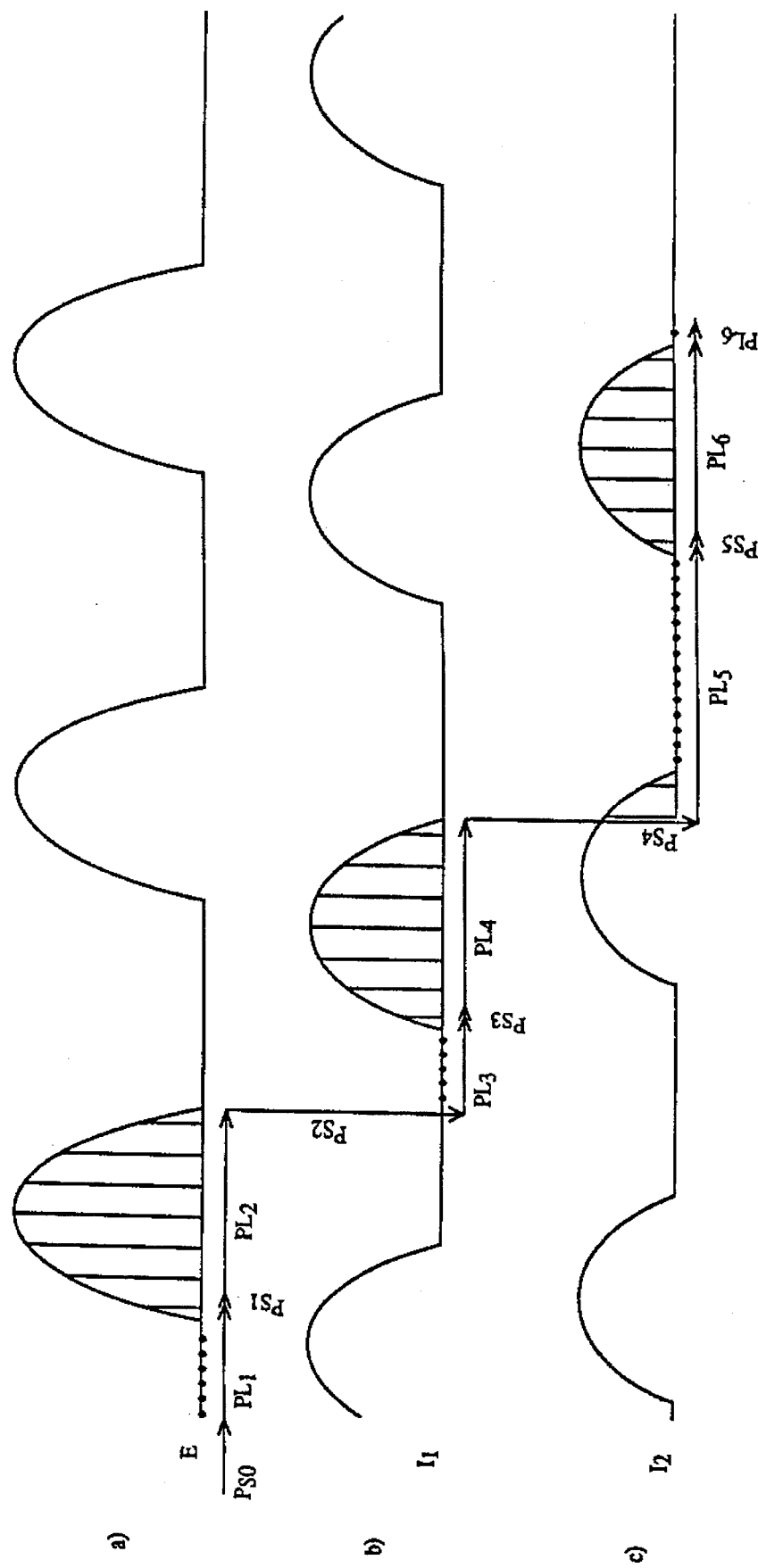
FIGS. 8(a)–8(c) illustrate synchronous program diagrams for amplitude and phase information using one voltage and two current signals as required for a tapchanger control.

FIG. 8(a) illustrates the synchronous measurement of the amplitude of a voltage E by program loop PL2 shown on FIG. 7. FIG. 8(b) illustrates synchronous measurement of the amplitude of a current I1 by program loop PL4 shown on FIG. 7. FIG. 8(c) illustrates synchronous measurement of the amplitude of a current I2 by program loop PL6 shown on FIG. 7. FIG. 8 also illustrates measurement of the phase angles between voltage E and currents I1 and I2 using zero crossing detecting program loops PL1, PL3, and PL5. Program loops PL1, PL3, and PL5, each one tik long, and amplitude measuring program loops PL2, PL4, and PL6 of FIG. 7, each two tiks long are linked together by program steps PS1, PS2, PS3, PS4, and PS5, each one tik long. FIGS. 7 and 8 together show entry into the synchronous measurement program by program step PS0 and the sequential operation of the program in the order PL1, PS1, PL2, PS2, PL3, PS3, PL4, PS4, PL5, PS5, PL6, and finally the exit by program step PS6.

Each dot on the axes of FIGS. 8(a), (b), and (c) represent the taking of digital samples whose value is zero and each vertical line under the positive signal half cycles of FIGS. 8(a), (b), and (c) represent the taking of digital samples whose values are non-zero. On FIG. 8, horizontal and vertical arrowed lines, starting with PS0, continuing with PL1, PS1, PL2, PS2, PL3, PS3, PL4, PS4, PL5, PS5, PL6, and ending with PS6 illustrate a synchronous measurement sampling path.

The ADC 2 control logic is set to sample an AC signal E every tik, and enter the results in a round robin fashion into the result registers R1, R2, R3, R4, R1, etc. as depicted by FIG. 1.

In FIG. 8, program loops PL1, PL3 and PL5, each one tik long, scan the result registers R1, R2, R3, R4, R1, etc. as depicted by FIG. 1, looking for transitions from a reading of zero to a non-zero reading (znz) and exiting when said transition is found. Measurement program loops, PL2, PL4 and PL6 each two tiks long, make a partial computation for the amplitude measurement of one half cycle of an AC signal, operating in time sequence as depicted by FIG. 2(b), and exiting when a non-zero to zero (nzz) transition is found.

There are various methods for obtaining amplitude measurements; two useful known methods are:

A. Take the square root of the sum of the squares of the samples (rms), wherein measurement program loops such as PL2 of FIG. 7 computes the sum of the squares.

B. Take the average of the samples where a measurement program loop computes the sum of the samples having the advantage of shortening said measurement program loop to one tik per turn.

An additional inventive method is described hereinbelow:

C. Take a filtered peak value (Ep) as the maximum of Ep from the recursive equation:

$$Ep=((D*Ep)+Es)/(D+1); \text{ during one half wave measurement of an AC signal, E,}$$

Where Es is each sample, and where D is found by multiplying the count of the number of samples in a previous half wave of the AC signal E by a constant K, and rounding the result to the nearest integer. K is chosen to be less than one so as to select a number of samples less than the total number of samples in a half wave of the AC signal. Note that "*" is used in equations herein to denote multiplication.

In this way, the choice of K determines the portion of a half cycle used in determining the peak amplitude of the wave regardless of the frequency of the AC signal.

Method A, listed above is used for the tapchanger control described further hereinbelow. Method B may be advantageous where the method permits a one tik measurement program loop thus improving the phase angle resolution. Method C is advantageous for volts per hertz measurements to be described hereinafter.

The following is a detailed description of the synchronous operation of the sub-program diagrammed in FIG. 4. FIG. 7 illustrates an unique real time flow diagram depicting the time sequence of programming events; however, the horizontal axis is a time sequence, but is not a linear time scale. Program loops PL2, PL4, and PL6 are shown twice as large as program loops PL1, PL3, and PL5 to illustrate the fact that the former three program loops are each two tiks long and the latter three program loops are each one tik long. Each of the program steps PS0 through PS6 is one tik long.

FIGS. 8(a), (b) and (c) show the portions of ADC 2 input signals E voltage, I1 current, and I2 current which fall within the active dynamic range of the ADC 2 as discussed in U.S. Pat. No. 5,315,527 referenced above. In contrast to FIG. 7, the horizontal axes of FIGS. 8(a), (b), and (c) are coordinated real time scales. Since one tik is so small on the time scale used, PS1, PS3 and PS5 appear as angled double brackets, >>. Program step PS0, which is the exit statement of a previous sub-program and the entrance statement for the subsequent synchronous sub-program, performs the following:

1) Switches AC voltage E into the ADC 2. (See FIG. 8(a)),
2) Starts program loop PL1. (See FIG. 7),
Program loop PL1 performs the following:
1) Takes samples of result registers R1, R2, R3, R4, (Shown in FIG. 1) in round robin fashion. As stated above, it is immaterial which register is read first,
2) Looks for zero samples of signal E,
3) After finding non-zero samples, looks for a non-zero sample of signal E, and
4) Exits to PS1 after the first non-zero sample of signal E is obtained.
Program step PS1 performs the following:
1) Sets a sum SS1 to zero,
2) Computes the square of the first sample of signal E and adds to the sum SS1 thus forming the sum of squares SS1 in accordance with method A above. At this point, one of the other alternative methods of determining the amplitude of the AC signal mentioned above could be used in lieu of the sum of squares method.
3) Records the number of the result register (R1, R2, R3, or R4) from which the first non-zero sample of signal E was taken,
4) Sets a count of tiks to zero, and
5) Exits to PL2.
Program loop PL2 performs the following:
1) Takes a sample of every other one of registers R1, R2, R3, R4, in round robin fashion as if PL2 had taken the first non-zero sample. For instance, if the register recorded under program step PS13) was R1, then this program loop samples: R3, R1, R3, R1 . . . etc. If the first register sampled was R4, then this program loop samples: R2, R4, R2, . . . etc.
2) Continues the summing of the squares SS1 of the samples of signal E,
3) Counts the number of samples of signal E,
4) Looks for a sample of signal E with the value zero, and when zero is sensed,
5) Updates the count of tiks with each turn of said loop, and
6) Exits to PS2.
Program step PS2 performs the following:
1) Records count of tiks as t1 and updates count of tiks,
2) Stores the sum of the squares SS1 of the samples of signal E,
3) Stores the count of the number of samples taken during PL2,
4) Switches current I1 signal to the ADC 2, and
5) Exits to PL3
Program loop PL3 performs the following:
1) Takes samples of result registers R1, R2, R3, R4, in round robin fashion,
2) Looks for zero samples of signal I1,
3) After finding zero samples, looks for a non-zero sample of signal I1,
4) Records the number of samples of signal I1 taken, 5) Updates the count of tiks with each turn of said loop, and 6) Exits to PS3 after the first non-zero sample of signal I1 is obtained or when the number of zero samples exceeds the expected number of samples for a complete cycle of signal I1, indicating that the amplitude of current I1 is zero.

Program step PS3 performs the following:

1) Records count of tiks as t2 and updates count of tiks,
2) Sets sum SS2 to zero,
3) Computes the square of the first non-zero sample of signal I1 and adds to the sum SS2 in accordance with method A above. At this point, one of the other alternative methods of determining the amplitude of the AC signal mentioned above could be used in lieu of the sum of squares method,
4) Records the number of the result register R1, R2, R3, or R4 corresponding to the register from which said first non-zero sample was taken, and
5) Exits to PL4

Program loop PL4 performs the following:

1) Takes a sample of every other one of registers R1, R2, R3, R4, in round robin fashion, as if PL4 had taken the first non-zero sample. For instance, if the register recorded under program step PS3 3) was R1, then this program loop samples: R3, R1, R3, R1 . . . etc. If the first register sampled was R4, then this program loop samples: R2, R4, R2, . . . etc.
2) Continues obtaining the sum of the squares SS2 of the samples of signal I1,
3) Counts the number of samples of signal I1,
4) Looks for a sample of signal I1 with the value zero, and when zero is sensed,
5) Updates the count of tiks with each turn of said loop, and
6) Exits to PS4.

Program step PS4 performs the following:

1) Records the count of tiks as t3 and updates count of tiks,
2) Stores the sum of the squares SS2 of the samples of signal I 1,
3) Stores the count of the number of samples taken during PL4,
4) Switches current I2 signal to the ADC 2, and
5) Exits to PL5

Program loop PL5 performs the following:

1) Takes samples of result registers R1, R2, R3, R4, in round robin fashion,
2) Looks for zero samples of signal I2,
3) After finding zero samples, looks for a non-zero sample of signal I2,
4) Records the number of samples of signal I2 taken, and
5) Exits to PS5 after the first non-zero sample of signal I1 is obtained or when the number of zero samples exceeds the expected number of samples for a complete cycle of signal I2, indicating that the amplitude of current I2 is zero.

Program step PS5 performs the following:

1) Records count of tiks as t4 and updates count of tiks,
2) Sets sum SS3 to zero,
3) Computes the square of the first non-zero sample of signal I2 and adds to the sum SS3 in accordance with said method A. At this point, one of the other said alternative methods of determining the amplitude of the AC signal could be used in lieu of the sum of squares method,
4) Records the number of the result register R1, R2, R3, or R4 corresponding to the register from which said first non-zero sample was taken, and
5) Exits to PL6

Program loop PL6 performs the following:

1) Takes a sample of every other one of registers R1, R2, R3, R4, in round robin fashion as if PL6 had taken the first non-zero sample. For instance, if the register recorded under program step PS5 3) was R1, then this program loop samples: R3, R1, R3, R1 . . . etc. If the first register sampled was R4, then this program loop samples: R2, R4, R2, . . . etc.,
2) Continues obtaining the sum of the squares, SS3, of the samples of signal I2,
3) Counts the number of samples of signal I2,
4) Looks for a sample of signal I2 with the value zero, and when zero is sensed,
5) Exits to PS6.

Program step PS6 performs the following:

1) Records count of tiks as t5 and updates count of tiks, Stores the sum of the squares SS3 taken by PL6,
3) Stores the count of samples taken by PL6,
4) Resets the watch dog timer, and
5) Exits the synchronous sub-program and links to the linear computations sub-program.

Note that there is no predetermined time position of signal I1 or signal I2 with respect to signal E, therefore the location of a znz transition by program loop PL3 and PL5 is necessary. As is seen in FIG. 8, program step PS2 switches to signal I1 at as time when samples of I1 have a value of zero. Program step PS4, on the other hand, switches to signal I2 at a time when signal I2 has a non-zero value. These sequences in FIG. 8 are for illustration only and, in general, program steps PS2 and PS4 may switch to signals I1 or I2 at a time when those signal values are either zero or non-zero.

LINEAR COMPUTATION SUB-PROGRAM FOR TAPCHANGER CONTROL

The linear computation (LC) sub-program 42 of FIG. 6 contains a number of routines, each with an entry and at least one exit point, and which run linearly (one at a time). The routines for a tapchanger control may typically include the following:

1) Compute the rms amplitudes of the signals E, I1, and I2 as depicted in FIG. 4. Note that the sums of squares SS1, SS2, and SS3 obtained by the SM sub-program, described above, for the signals E, I1, and I2 respectively are related to the rms amplitudes of the signals and may be used with properly matched values representing setpoint amplitude limits for control purposes without the necessity of computing the square roots of said sums of squares.

2) Compute the phase angle between the voltage signal, E, and a current signal. With said clock operating at 2 Mhz, a tik is 16 microseconds which is equal to 0.35 degrees at the nominal power frequency of 60 Hz. Resolution of phase angles to within one degree are quite adequate for the computations required for a tapchanger, therefore the phase angle can conveniently be expressed in tiks, with no need to convert tiks to more conventional measures of phase angle such as degrees or radians.

The phase angles between signals E and I1, for example, can be obtained from the zero-non-zero transitions of the two signals. Expressed in tiks, "t", the phase angle of I1 with E as the reference is either "t2", "t3"–"t1", or preferably the average of "t2" and "t3"–"t1", where count of tiks, "t1", was recorded in program step PS2, above, count of tiks, "t2", was recorded in program step PS3, above and count of tiks, "t3", was recorded in program step PS4, above. Likewise, the phase angle of I2 with E as the reference is either "t4", "t5"–"t1", or preferably the average of "t4" and "t5"–"t1". Count of tiks, "t4" and "t5" were also recorded in program steps above. As is well known, multiples of 360° in tiks can be subtracted to obtain the phase angles as less than 360°. As is also well known, the time for one tik will be known permitting phase angles to be converted to more familiar angles in degrees or radians, however it is often more efficient to convert familiar mathematical processes to time expressed in tiks thereby avoiding conversion program steps as a program is executed. Please refer to the above referenced U.S. Pat. No. 5,315,527 for earlier disclosures regarding the procedures of this paragraph.

EXTERNAL COMMUNICATIONS SUB-PROGRAM

The external communications (EC) consists of the sending of bursts of data to an external personal computer (PC) 63 used as the man-machine interface. The bursts alternatively consist of signal amplitude and phase angle data compacted for rapid serial transmission at, say 115 kilobaud as provided by the MCU 1 of FIG. 4, using the asynchronous serial communications (SCI) port labeled 9.

Alternatively an associated computer 63 used as the man machine interface for a tapchanger such as tapchanger 62 of FIGS. 9 and 10 may request the tapchanger 62 to send previously established set points. The EC may then send a serial burst of said set points from tapchanger 62 to said computer 63 for viewing and possibly changing by an operator of computer 63. Once satisfied with a newly established set of setpoints, the operator may request the EC to send a modified serial burst of setpoints to device 62 wherein the serial stream of setpoint data is separated and where changes have been made, the setpoints held in non-volatile memory 6 in the device microcontroller 1 are changed.

Note that as described above, computer 63 of FIG. 9 may also serve as a Network Interface Module in interfacing with a Local Area Network (LAN) through computer 67.

THE COMMUNICATOR

The personal computer 63, together with the appropriate program, used as an MMI for a SLIM, FIGS. 4, 7, 10, will hereinafter be referred to as "the communicator".

FIG. 9 shows a data readout system comprising a tapchanger control 62 having a telephone connecter 79 connected on-line control to a personal computer 63, such as a laptop, via a telephone cord 64 carrying bursts of data at 115 kilobaud. This computer 63, in turn, is connected via its modem 71 output and telephone circuit 66 to a remote station computer 67, with its modem 68 nominally using 2400 to 9600 baud rates. Voltage isolator 69 is used as required for power frequency voltage and transient isolation of tapchanger control 62.

As described previously, data is sent at high frequency in short bursts by the tapchanger control 62 so as to have a minimal effect in slowing down the primary tapchanger control function as would be similarly beneficial to other applications of the inventive SLIM technology. The computer 63 acts to receive the data in bursts at the high rate and output it more continuously at, say 2400 baud. The first computer 63 may also generate a display of data such as a voltage graph line vs time. The time scale may be chosen from one second to hours, days or weeks. The vertical scale for a voltage display is selectable to show a range of +/–5%, +/–10%, or +/–20% of a nominal 120 v with zero suppressed below the screen. The display will move across the screen towards the left, with newest data at the right.

The computer 67 can generate the same display as computer 63. Alternatively the data from tapchanger control 62 can be combined with other data which may be available a the remote location for a wide range of uses, such as the combined power loading on a number of tapchanging transformers.

Material displayed on the screen 73 as well as other data from computer 63 can be printed by printer 61.

The communicator computer 63 can also serve as a NIM connected to computer 67 as the first of a network of computers forming a LAN; said LAN network beyond computer 67 not being shown in FIG. 9. In that use, computer 67 contains a selected one of the many protocols required for use with LAN's.

Connector 79 provides communications to computer 63 via cable 64 having voltage isolator 69 serially interconnected in cable 64. Computer 63 is connected to printer 61. Computer 63 is also connected to computer 67 by circuit means 66 using modem 71 on computer 63 and modem 68 on computer 67.

FIG. 10 shows an alternate data readout system in which the first computer 63 receives the bursts of data from the tapchanger control 62 from connector 79 via cable 64 and forms a screen display 73.

The computer 63 selectively generates a touch-tone code for access to a desired remote FAX machine 70 and then sends a screen dump by FAX via telephone connection means 66 using modem 71 in computer 63 and modem 68 in remote FAX machine 70 which in turn provides FAX output 70A. Cellular telephone 72 is alternatively connected to telephone modem output 71 for FAX transmission to remote FAX machine 70. As a further alternative, local FAX machine 73 is connected to telephone modem 71 to provide local readout 73A of data screens from computer 63.

The computer 63 can send a screen dump FAX via its telephone output 71 in various time sequences, a) each time the screen is renewed; i.e. once per hour with a one hour time scale, b) at a certain time of day, c) half of the horizontal time scale in use after a specified abnormality; for example an indication of a voltage above a given level with automatic scale switching to show the abnormal voltage properly, and with the time of the abnormality being stamped and the voltage scales clearly shown.

APPLICATION FOR VOLTS/HERTZ MEASUREMENT

For another example of the use of the inventive SLIM methods, consider FIG. 11 showing the processing of a three phase voltage to provide a device for measuring volts per hertz (E/Hz) from the highest of the three input voltages, the frequency being the same for all three voltages.

This device can be expected to take protective action to protect a generator or transformer, as is known in the art. Generator protection sometimes requires operation from 2 to 120 Hz., and this requirement is met by the inventive measurement apparatus and method described hereinafter.

In this example, the positive half cycles of AC voltage signals EA, EB, and EC are digitized and the negative half cycles suppressed to zero as described in detail in U.S. Pat. No. 5,315,527 referenced above.

FIG. 11 shows three voltages, EA, EB, and EC, producing inputs to the ADC 2; these voltages are most usually from each phase to neutral. For an electric utility application the nominal voltage can be expected to be approximately two times the frequency and can range from 4 volts at 2 Hz., through 44 volts at 22 Hz., through 120 volts at 60 Hz., to 240 volts at 120 Hz. Signal EA is scaled by resistors R50 and R56 to ADC 2 input A0 as signal EA' and by resistors R51 and R59 to ADC 2 input A3 as signal EA". Signal EB is scaled by resistors R52 and R57 to ADC 2 input A1 as signal EB' and by resistors R53 and R60 to ADC 2 input A4 as signal EB". Signal EC is scaled by resistors R54 and R58 to ADC 2 input A2 as signal EC' and by resistors R55 and R61 to ADC 2 input A5 as signal EC".

The scaling resisters are shown such that each one of EA', EB', and EC' signal inputs to the ADC 2 is within the linear range of the ADC 2 from 2 to 22 Hz and each one of EA", EB" and EC" signal inputs is within the linear range of the ADC 2 from 21 to 120 Hz. An overlap at 21/22 Hz makes it possible for the program to switch all three inputs at 22 Hz for a raising frequency or at 21 Hz should the frequency fall. The hysteresis avoids program confusion or hunting that can be expected otherwise. This dual range, switching said scaling resisters at the geometric mean of the highest and lowest input signal frequency, avoids the problem of an 8 bit ADC otherwise not adequately covering the dynamic voltage range.

Each ADC 2 input A0, A1, A2, A4, A5, A6 is shown clamped to +5 v by respective diodes D60–D65 for overvoltage protection with current through the diodes properly limited by resistors R50–R55.

Most frequently an E/Hz protective relay is used to protect against saturation of the iron core of a generator or transformer and the heating of the iron that may result. Since this effect is related to the peak voltage, the method C of making amplitude measurements stated above is the preferred method and will be used in the following example.

Method C cited above, for making amplitude measurements is advantageous in determining a peak voltage that may result, in part, from harmonic voltages since method C is independent of the phase angles of said harmonics. This inventive use of a high sampling rate provides a measurement of the peak voltage on a cycle by cycle basis: such a measurement is not achievable with a lower sampling rate of say, 16 samples per cycle.

Figure 12:
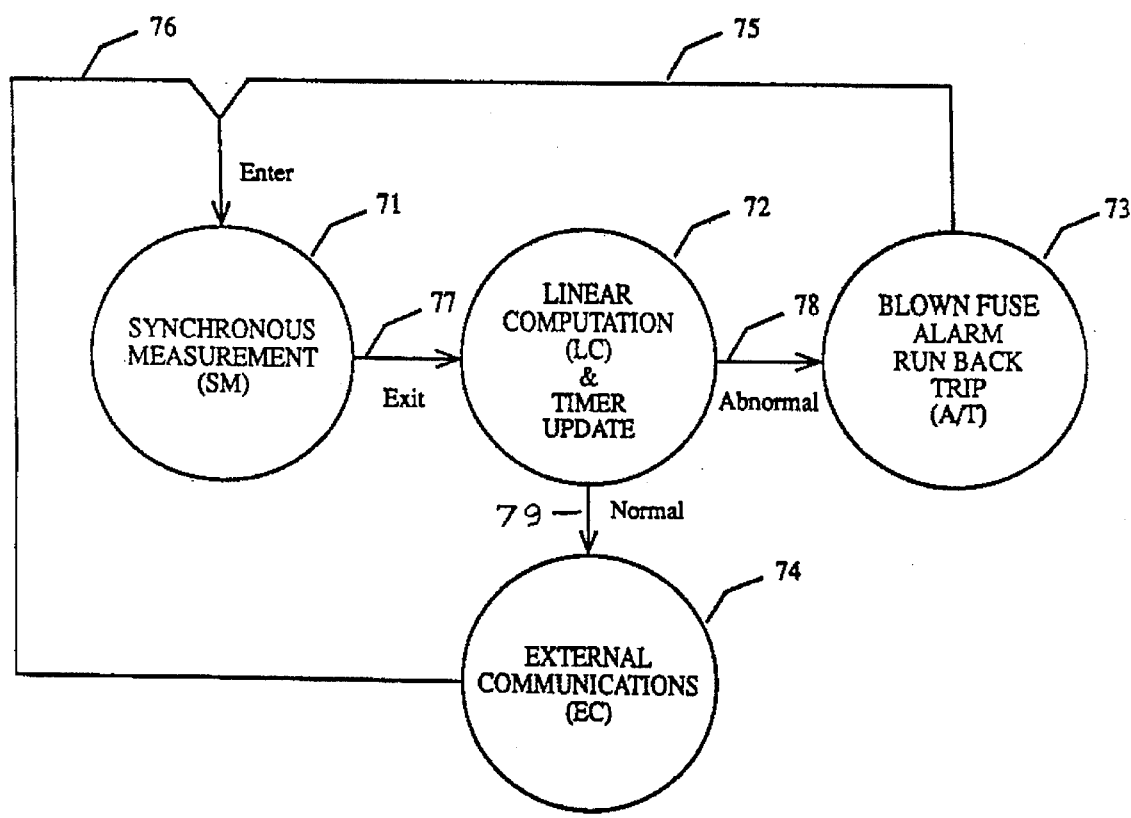
FIG. 12 is a flow chart for the SLIM measurement and control program for a volts per hertz relay.

FIG. 12 is a flow chart for SLIM as used with a volts per hertz relay. The SM sub-program 71 is entered from program transition step 75 or 76, the LC sub-program 72 is entered from program transition step 77, the alarm or trip sub-program A/T 73 is entered from program transition step 78 and EC 74 is entered from program transition step 79. The path from A/T back to SM is 75. The sub-programs operate one at a time and all have a single entry point. All but LC 72 have a single exit point; LC 72 branching is dependent on the volts per hertz computation result.

Figure 13:
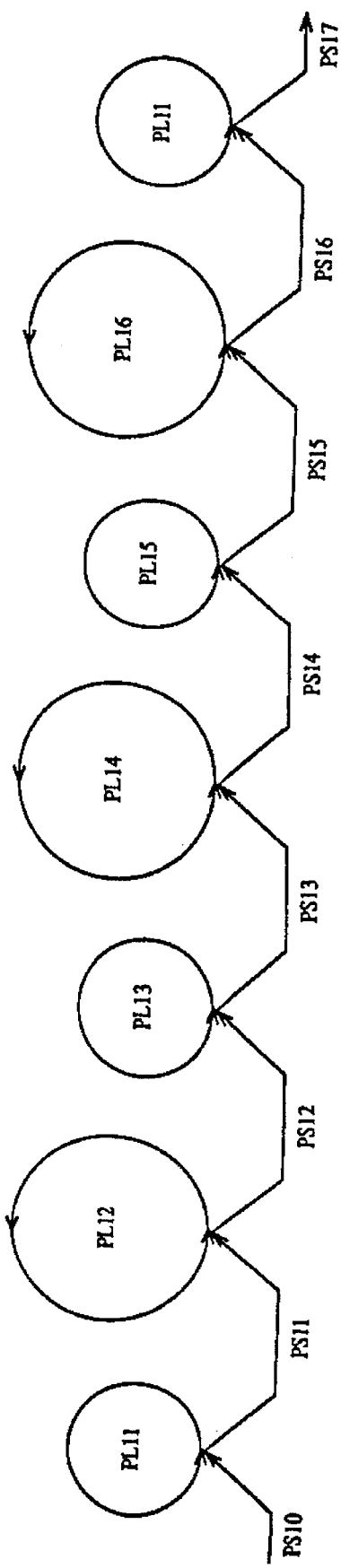
FIG. 13 is a flow chart of the SLIM measurement program used for a volts per hertz relay.
Figure 14:
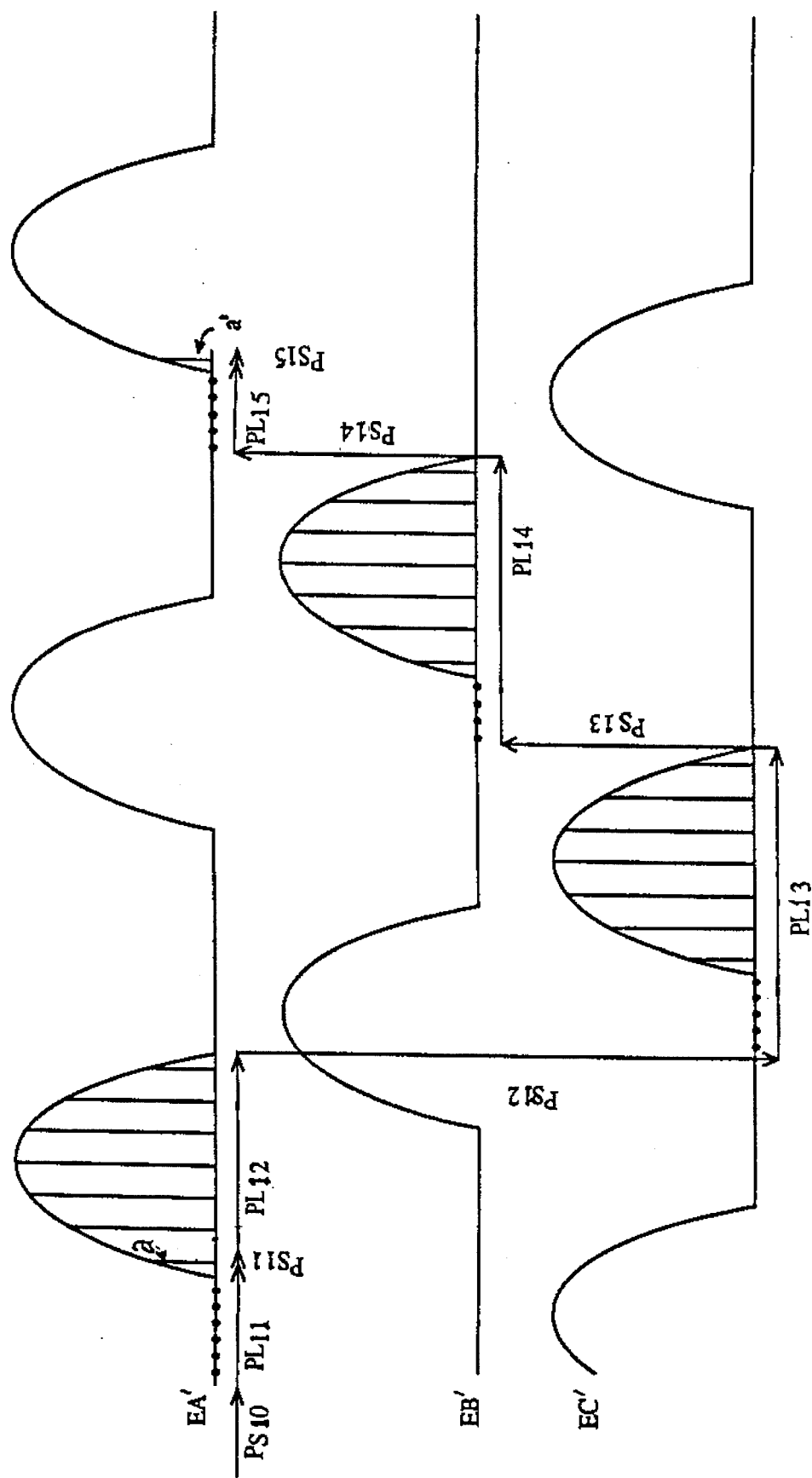
FIG. 14 illustrates synchronous program diagrams for amplitude and phase information using three phase voltages signals as required for a volts per hertz relay.

FIG. 13 depicts a flow diagrams of a synchronous subprogram for selecting the highest of three voltages using method C for determination of voltage amplitude and from that highest voltage determining E/Hz as advantageous for use in an E/Hz protective relay, the sub-program uses program steps and program loops operating as shown in FIG. 14 where the sampling path starting with arrow PS0 and ending with shortened arrow PS1 can be followed as dots representing digital samples whose values are zero and vertical lines rising to a positive half cycle representing digital samples whose values are non-zero. Note that whereas FIG. 14 shows input signals EA', EB' and EC' it will be understood that this diagram also applies where the signals are EA", EB" and EC" for purposes to be described below.

Note that in FIG. 13 program loops PL11, PL13 and PL15 are one tik long and program loops PL12, PL14, and PL16 are two tiks long.

Sub-program step PS10, which is the exit statement (program transition steps 75 or 76 of FIG. 12) of a previous sub-program and the entrance statement for the synchronous E/Hz measurement sub-program, performs the following:

1) Switches AC voltage signal EA' into ADC 2,

2) Wait one tik,

3) Exits to program loop PL11.

Program loop PL11 performs the following:

1) Takes samples from result registers R1, R2, R3, R4, in round robin fashion,

2) Looks for samples of signal EA' with values of zero,

3) After finding zero samples, looks for a non-zero sample of signal EA',

4) Exits to PS11 after the first non-zero sample is taken.

Program step PS11 performs the following:

1) Records the first non-zero sample of signal EA' as (a),

2) Starts a count of tiks,

3) Exits to PL12

Program loop PL12 performs the following:

1) Takes samples of voltage signal EA' from every other register R1, R2, R3, R4, in round robin fashion, 2) Looks for the peak voltage of signal EA' using method C, 3) Continues the count of tiks, 4) Looks for a sample of signal EA' with the value zero, and when sensed, 5) Exits to PS12

Program step PS12 performs the following:

1) Stores said peak voltage of signal EA' obtained by PL12,

2) Switches voltage signal EC' to the ADC 2,

3) Continues the count of tiks,

4) Exits to PL13.

Program loop PL13 performs the following:

1) Takes samples of voltage signal EC' of every other result register R1, R2, R3, R4, in round robin fashion, 2) Looks for the peak voltage of signal EC' using method C, 3) Continues the count of tiks, 4) Looks for a sample of signal EC' with the value zero, and when sensed, 5) Exits to PS13

Program step PS13 performs the following:

1) Stores said peak voltage of signal EC' obtained by PL13,

2) Switches voltage signal EB' to the ADC 2,

3) Continues the count of tiks,

4) Exits to PL14.

Program loop PL14 performs the following:

1) Takes samples of voltage signal EB' of every other result register R1, R2, R3, R4, in round robin fashion, 2) Looks for the peak voltage of signal EB' using method C, 3) Continues the count of tiks, 4) Looks for a sample of signal EB' with the value zero, and when sensed, 5) Exits to PS14.

Program step PS14 performs the following:

1) Stores said peak voltage of signal EB' obtained by PL14,

2) Switches voltage signal EA' to the ADC 2,

3) Waits one tik,

4) Continues the count of tiks,

5) Exits to PL15.

Program loop PL15 performs the following:

1) Takes samples of voltage signal EA' of every other result register R1, R2, R3, R4, in round robin fashion, 2) Continues the count of tiks, 3) Looks for a non-zero sample of signal EA', 4) Exits to PS15 after the first non-zero sample is taken.

Program step PS15 performs the following:

1) Records the first non-zero sample of signal EA' from PL15 as (a'),

2) Records the number of tiks up to and including the one where the first non-zero sample (a') of signal EA' was taken in PL15.

3) exits the synchronous sub-program and links to the linear computation (LC) sub-program. See program transition step 77 of FIG. 12.)

Note that in contrast with the program depicted on FIG. 8, in the program depicted on FIG. 14 and described above, the relative phase positions of signals EA', EB' and EC' are known within a reasonable tolerance. Moreover with the peak determining method C of amplitude measurement shown on FIG. 14 and described above, it is not necessary to determine the znz transition of EC' or EB'. The peak amplitudes of signals EC' and EB' are determined by program loops PL13 and PL14 by averaging less than the total number of non-zero samples of the half cycles of signals EC' and EB' with the zero samples preceding the non-zero samples having no adverse effect. If the rms amplitude method A or the average of samples method B were used, the znz transitions of signal EB' and EC' would be required. A further description for the choices of Method A or B for measurement of E/Hz is not included herein.

LINEAR COMPUTATION SUB-PROGRAM FOR E/HZ

This program completes the computation of volts per hertz using inventive method C of obtaining the peak amplitudes of signals EA', EB', and EC', by choosing the highest said peak amplitude.

The count of tiks from each of the program loops is added to the fixed count of the program steps so as to find the time, "N", in tiks from the taking of the first non-zero sample, "a", of EA' until the taking of the last non-zero sample, a'. This time is approximately the period of two cycles and is corrected for greater accuracy using the Equation (1) derived below:

Sample a is at approximately 0°

Sample a' is at approximately 720°

$\alpha = \sin \Theta = a/EA'$ (correction in angle in radians at 0°)

$\alpha' = \sin \Theta' = a'/EA'$ (correction in angle in radians at 720°)

The '720°' is too short by $\alpha$ radians at the start.

The '720°' is too long by $\alpha'$ radians at the end.

The correction in radians is $(\alpha-\alpha')=(a-a')/EA'$

The time, T in clock cycles, between a and a' is $(N-1)*t$

Where N is the number of tiks from the time a was taken to the time a' was taken, And where t is the ADC conversion time in clock cycles, Now the ratio of correction of the period in time to the period in time is equal to the ratio of the correction of the angle in radians to the period of $4\pi$ radians.

$$\Delta t/T = (\alpha-\alpha')/(4\pi+(\alpha-\alpha'))$$

$$\Delta t = T(\alpha-\alpha')/(4\pi+(\alpha-\alpha'))$$

where $\Delta t$ is the correction to time T, in clock cycles, to give the true period P of the signal, in clock cycles.

The period $P = T + \Delta t = T + T(\alpha-\alpha')/(4\pi+(\alpha-\alpha'))$

Which becomes: $P = T(1+1/\text{factor})$, where:

factor $= (4\pi/(\alpha-\alpha'))+1$

Now $4\pi/(\alpha-\alpha')$ is very large as compared to 1, so:

$P = T(1+(\alpha-\alpha')/4\pi)$

E/Hz = Emax*P, and $T = (N-1)*t$ (see above)

E/Hz = Emax*$(N-1)*t*(1+(\alpha-\alpha')/4\pi)$

Substituting $\alpha = a/EA$ and $\alpha' = a'/EA$ $$E/Hz = E\max*(N-1)*t*(1+(a-a')/(4\pi*i\ EA)) \quad (1)$$

Where EA is the peak voltage measured from signal EA' and Emax is the largest peak voltage selected from EA', EB', and Ec'.

Note that equation (1) gives E/Hz with clock cycles being the unit of time and can be converted to time in seconds by multiplying by the length of one clock cycle in seconds. Equation (1) is therefore useful in reducing the error in frequency measurement. It is well known that further computation can be carried out with either clock cycles or seconds as measures of time.

At this point, if 1/P>22 Hz and the previous measurement used signals EA', EB' and EC' then substitute signals EA", EB", and EC". If 1/P <21 Hz and the previous measurement used signals EA", EB" and EC" then substitute signals EA', EB', and EC'. If communications is requested, serve the request. See program transition step 79 of FIG. 12. In either case, return to the synchronous measurement program step PS10.

APPLICATION TO MEASURE SINGLE PHASE SIGNAL DIFFERENTIALS

The following will illustrate a further inventive form of a synchronous program advantageously used in a differential relay. The most common use of signal differential measurements is for a current differential relay. FIG. 15 shows a circuit diagram for a current differential relay with eight AC input analog signals T1-1, T3-1, T1-2, T3-2, T2-1, T4-1, T2-2, and T4-2 to the ADC 2 portion of an MPU. Each signal is named starting with "T" to identify it with its source current transformer. The input analog signals T1-1, T3-1, T1-2, T3-2, T2-1, T4-1, T2-2, and T4-2 are provided by the secondaries of four current transformers (CT's), T1, T2, T3 and T4 with resistors R21, R22, R23 and R24 respectively as burdens. In one well known application these transformers sense a current in two locations, yielding Iin and Iout, chosen so that any instantaneous difference in the current sensed is an indication of a fault between said two locations.

Whereas U.S. Pat. No. 5,315,527 referenced above discloses in detail the digitization of AC signals of a selected polarity, in this application it is necessary to digitize both polarities. This is accomplished by forming two signals of each input AC current of opposite polarity and selecting the positive polarity of both signals as separate inputs to the ADC. Each of said two signals are digitized as described in U.S. Pat. No. 5,315,527 with the negative half cycle suppressed to zero, but since the said two signals are of opposite polarities from each other, both polarities of the input AC currents Iin and Iout are digitized.

Each transformer T1, T2, T3, T4 has a center tapped secondary S11, S21, S31, S41 providing pairs of identical signals T1-1, T1-2; T2-1, T2-2; T3-1, T3-2; and T4-1, T4-2 for each sensed current. In this application either polarity of a signal wave may contain the earliest indication of a signal differential indicative of a fault. Furthermore, whereas the no-fault current will have cycles of opposite polarity which are mirror images of each other, fault currents will generally have cycles of opposite polarity which differ from each other and therefore the entire wave must be digitized and analyzed for fault conditions.

Each of a said pairs of identical signals, however, are of opposite polarity, and when connected to an ADC 2, provide for digitization of the entire AC signal. Signals of each polarity are therefore scaled as described hereinafter and coupled to ADC 2 inputs.

Industry standards and practice indicate that the magnitude of a current of interest may vary from 0.25 amps to 5 amperes for normal load conditions and up to 100 amperes for fault conditions, giving a dynamic range ratio of 100/0.25, or 400. This exceeds the dynamic range of either an 8 bit ADC or an inexpensive CT. FIG. 15 shows an inventive arrangement of inexpensive current transformers T1, T2, T3, T4 and their connection to an eight input ADC 2 which provides the required dynamic range.

Current transformers T1 and T3, each having a turns ratio Tr1, together with their burden resistors R21 and R23, provide linear transformation of respectively associated input currents Iin and Iout for input currents up to 100 amperes. Scaling resistor combinations R25/R26, R27/R28, R29/R30 and R31/R32 provide five volts peak to corresponding ADC 2 inputs for 100 amperes of primary Iin and Iout current.

It is desirable to compare the magnitudes of a first signal pair, T1-1 and T3-1 of a first polarity and also of a second signal pair, T1-2 and T3-2 of a second polarity whenever the magnitudes are within the linear range of said ADC 2.

Current transformers T2 and T4, each having a turns ratio Tr2, together with their burden resistors R22 and R24, provide linearity from 0.25 to 5 amperes of primary input current. Scaling resistor combinations R33/R34, R35/R36, R37/R38 and R39/R40 provide five volts peak to corresponding ADC 2 inputs for values of currents Iin and Iout up to five amperes. Said CT's T2 are T4 are capable of carrying 100 amperes for one second, however above 5 amperes primary current, they saturate, limiting the voltage across their secondaries.

It is desirable to compare the magnitudes of a third signal pair, T2-1 and T4-1 of a first polarity and also of a fourth signal pair, T2-2 and T4-2 of a second polarity whenever the magnitudes are within the linear range of said ADC 2.

This dual range of current transformers avoids the problem of an 8-bit ADC otherwise not adequately covering the required current dynamic range. This inventive circuit provides two CT's in series for each input current Iin and Iout whereby each transformer need only have a linear range ratio of 20 at a lower combined cost than for a single CT with a linear range of 400. Moreover, a single transformer producing 5 volts peak with a 5 ampere primary current would produce 100 volts peak at 100 amperes primary current. This excessive voltage would produce a current into the ADC 2, which would be difficult to limit to safe levels.

As can be seen from FIG. 15, a total of eight ADC 2 inputs provide sensing of both polarities of both current Iin and Iout, four being used for the low amplitude currents and four for the high amplitude currents. Put another way, the combination of input currents, Iin and Iout, multiplied by two to account for the two current transformers used with each current to provide the required dynamic range and multiplied by two again to account for the two polarities required for each signal gives a total requirement of eight signals. The samples taken at each said input are suppressed to zero during the negative portions of each of the eight input analog signals. These eight signals are coupled by scaling resistor pairs R25/R26 connected signal T1-1 connected to ADC 2 input A0, R27/R28 producing signal T3-1 connected to ADC 2 input A1, R29/R30 producing signal T1-2 connected to ADC 2 input A2, R31/R32 producing signal T3-2 connected to ADC 2 input A3, R33/R34 producing signal T2-1 connected to ADC 2 input A4, R35/R36 producing signal T4-1 connected to ADC 2 input A5, R37/R38 producing signal T2-2 connected to ADC 2 input A6, and R39/R40 producing signal T4-2 connected to ADC 2 input A7.

Figure 16:
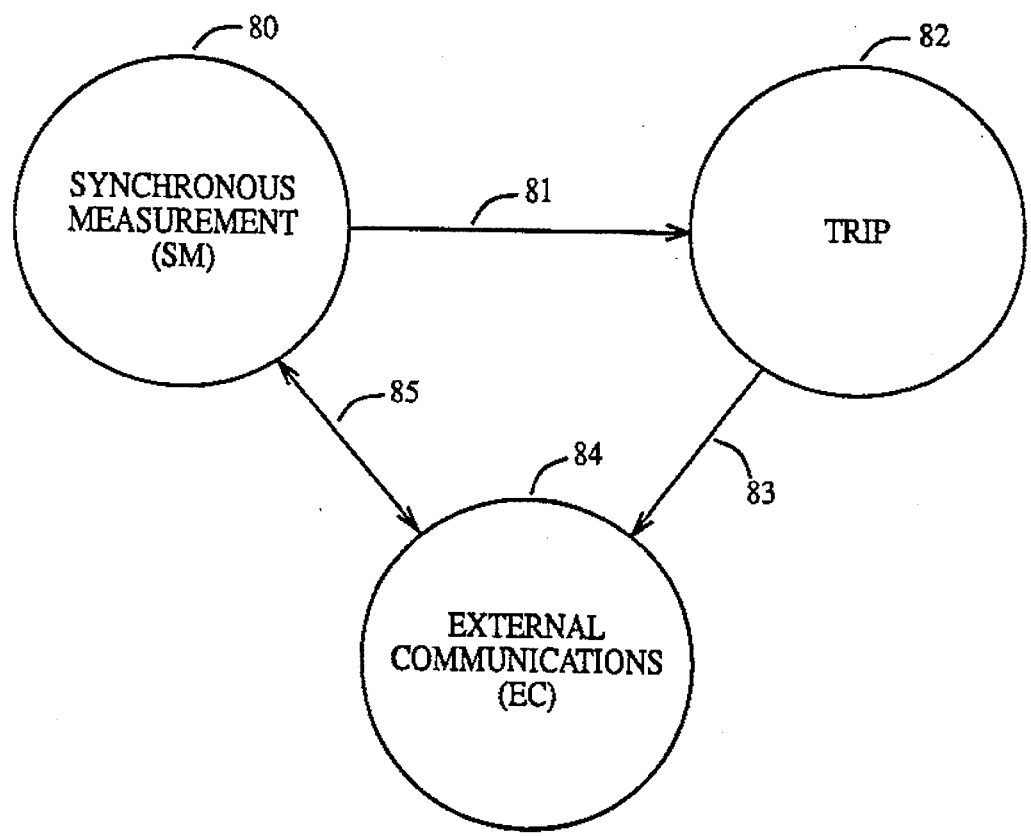
FIG. 16 is a flow chart for the SLIM measurement and control program for a differential relay.

FIG. 16 shows a flow diagram for the SM, EC, and a trip sub-program forming a SLIM program for a differential relay. SM sub-program 80 measures the unbalance in currents and exits by program transition step 81 to a trip sub-program 82 which produces an output to trip a current interrupting means when so indicated by said measurement. Once the tripping output is formed, there is no further requirement for the SM in 80 and a different sub-program SM in trip 82 can read and store current data until the breaker opens. Once the breaker opens, program transition step 83 transfers operation to EC sub-program EC providing data to external systems useful in evaluating the operation of the current interrupting means. When sub-program EC 84 is complete, the program returns to SM 80 via program transition step 85. Alternatively, SM 80 can selectively provide communications by transferring to EC 84 via program transition step 85 and returning to SM via program transition step 85 when computations are complete.

Figure 17:
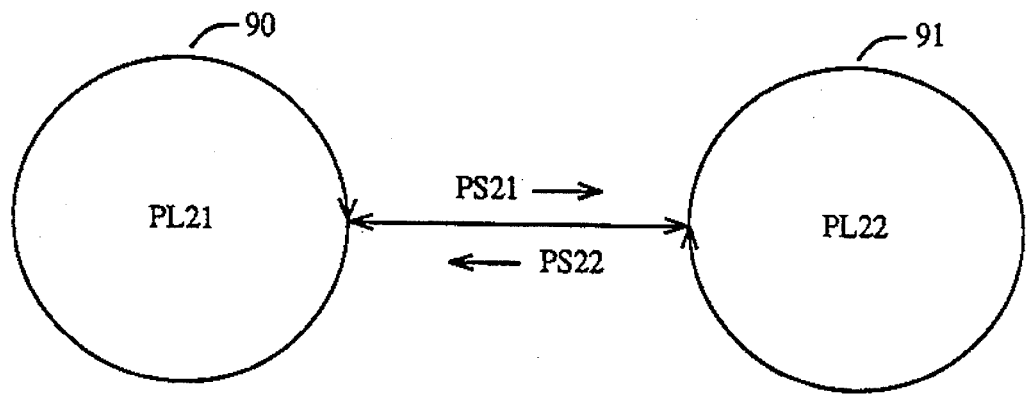
FIG. 17 is a flow chart of the SLIM measurement program used for a differential relay.

FIG. 17 shows one form of the SM portion in which two synchronous sub programs work in round robin fashion, one after the other. One program loop, PL21, identified as 90, samples four ADC 2 registers which, using the second operating mode of the ADC 2 takes digital samples from four signals, T1-1, T3-1, T1-2, and T3-2. PS21 switches the ADC 2 to converting input signals T2-1, T4-1, T2-2, and T4-2 and enters PL22, identified as 91. PL22 (91) then samples the latter four registers. PS22 (91) reverses the process, returning to PL21 (90). Program steps PS21 and PS22 need not be synchronous, but rather are as short as possible. As explained above, each of the synchronous program loops automatically synchronize with the ADC 2 as soon as they start.

The differential criteria for tripping may take various well known forms, such as counting signal differentials above a limit. This tripping criteria is continuously computed by the two synchronous program loops of FIG. 17. When this occurs within SM 80 of FIG. 16, the program branches by 81 to the tripping output 82 which generally will be used to trip one or more circuit breakers interrupting currents Iin and Iout of FIG. 15. In addition to the functions of PS21 and PS22 stated above, they also interrogate EC for a request for communications. If such a request is found, the program sends a message, the message being held very short so as to form a minimal interruption to the differential fault detection.

Figures 1, 18:
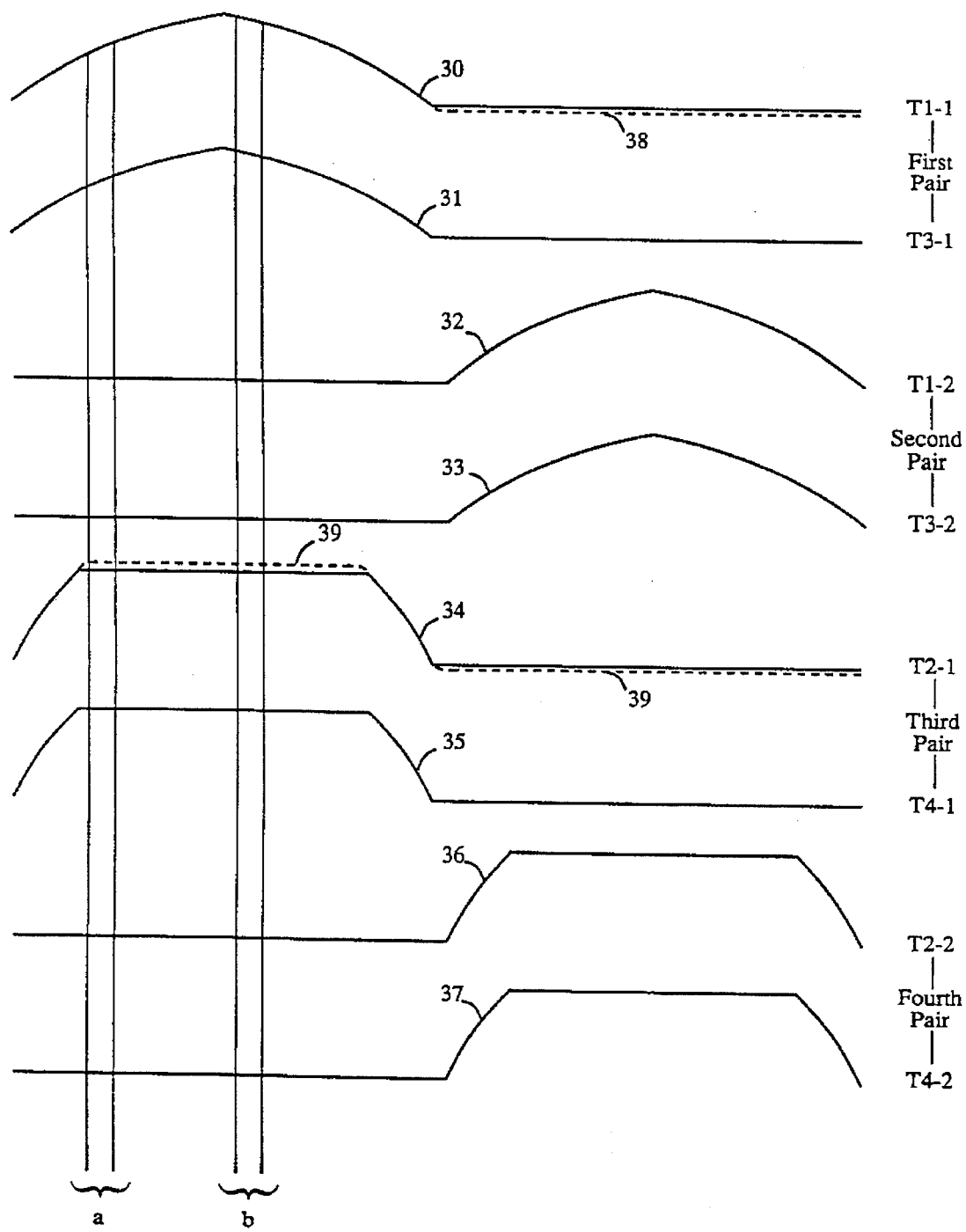
Figures 2, 18:
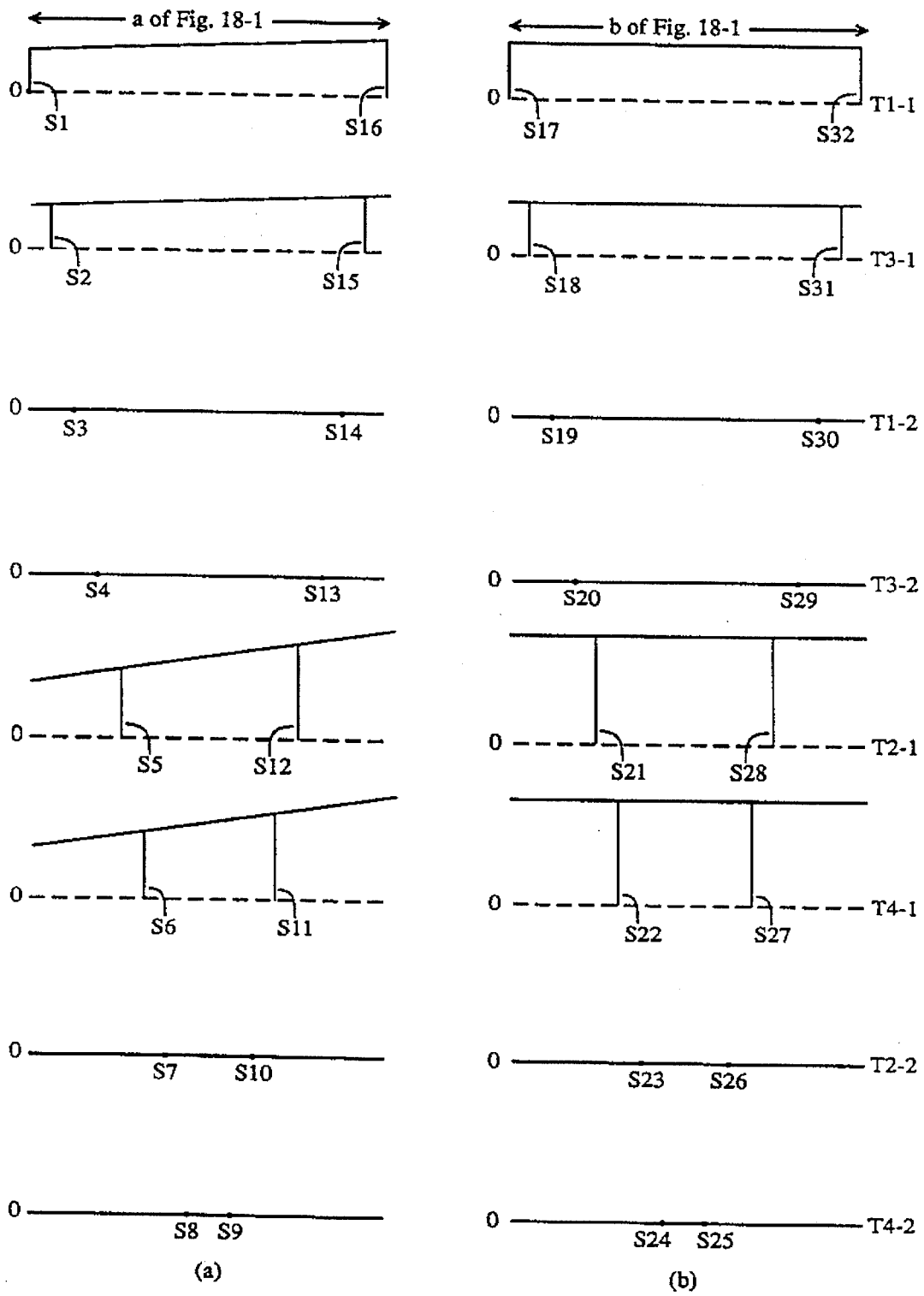

FIG. 18-1 shows one cycle of AC signal input to each of the eight ADC 2 inputs of FIG. 15, T1-1, T3-1, T1-2, T3-2, T2-1, T4-1, T2-2 and T4-2. The solid graphs 30, 31, 32, 33, 34, 35, 36, and 37 show not the analog waves themselves but a profile of the ADC 2 digital samples that can result from each wave. FIG. 18-1 shows the typical analog signal T2-1 as a dotted line 39. The dotted line 39, where above five volts, is limited by the forward drop across protective diodes D1 (see FIG. 15) with the diode currents limited by resistors R25, R27, R29, R31, R33, R35, R37, and R39. The dotted line 39, where below zero volts, is limited by the forward drop across protective diodes ID1 in microcontroller 1 of FIG. 11, and again the forward current through these protective diodes is limited to safe values by resistors R25, R27, R29, R31, R33, R35, R37, and R39.

The graphs of FIG. 18-1 represent inputs of 100 amperes for currents, Iin and Iout (See FIG. 15). Signals T1-1, T3-1, T1-2, and T3-2, provided by transformers T1 and T3 provide linearity from 5 to 100 amperes of Iin and Iout current. Signals T2-1, T4-1, T2-2, and T4-2 provided by transformers T2 and T4 provide linearity from 0.25 to 5 amperes of Iin and Iout current.

Note that while both polarity of the current signals are required as ADC 2 inputs in this application, here the use of the ADC 2 digitization characteristics to form a virtual rectifier as described in reference U.S. Pat. No. 5,315,527 is used to cause the point wherein the positive voltage into one of a pair of ADC 2 inputs falls to zero to be at the precise time where the voltage into the other of the pair rises above zero. For example, the time when the positive portion 30 of signal T1-1 in FIG. 18-1 ends is precisely when the positive portion 32 of signal T1-2 in FIG. 18-1 rises from zero.

THE SYNCHRONOUS MEASUREMENT SUB-PROGRAM FOR SIGNAL DIFFERENTIALS

In the synchronous measurement sub-program, samples are arranged in four pairs as stated above. Because said sample pairs are so close together in time, they are not expected to vary, in the absence of a fault, by more than a small amount. Any variance in the sample pairs is created by the time skew due to the fact that the two samples in each pair are not taken at precisely the same time. There will be one program step between samples with the minimum time of a program step being one tik. As has been explained earlier, with a 2 megahertz system clock, one tik equals 16 microseconds. At 60 hertz, this is approximately 0.35 degrees which would give about 0.6% worst case difference near a signal zero crossing. This value permits resolving very small differences in amplitude of any pair of samples caused by a power system fault. Note that the inventive apparatus and methods described here will give approximately 520 digital samples per half cycle of the power frequency or 65 samples per half cycle for each of the ADC 2 signal inputs T1-1, T3-1, T1-2, T3-2, T2-1, T4-1, T2-2 and T4-2.

For greater clarity, slices "a" and "b" of FIG. 18-1 are shown with an expanded time scale in FIGS. 18-2, (*a*) and (*b*).

Note that program step 16 returns to program step one, thereby forming a program loop consisting of program steps 1 through 16. Said program loop obtains samples in sequence beyond sample 16 in groups of 16 samples per turn of said program loop.

The microcontroller 1 utilizes a single capacitor to sample all input voltages in turn and hold the voltage sample until the conversion to binary is complete. This results in a charge being left on the single capacitor after each conversion which is dependent on the signal voltage level of the sample just converted. This charge can cause a small error in each succeeding conversion dependent on the change in the level from one signal to the next.

As stated above, the samples are arranged in a first pair, a second pair, a third pair, and a fourth pair as shown in FIG. 18-1. Note that the upper trace of each pair is an Iin signal and the lower trace of each pair is an Iout signal. Little change is expected except between Iin and Iout except when a fault occurs. The sequence of sampling using an HC11 can be expected to produce an error in the first sample of each pair and result in an error in the difference between the two samples of each pair. This is explained in more detail by FIG. 18-2.

FIG. 18-2 expands the vertical slices a) and b) of FIG. 18-1 timewise with the digital sampling sequence proceeding from top to bottom and back to the top as numbered S1 through S16 and S17 through S32. This order of sampling has the effect that the error in any said pair in the downward direction of sampling is opposite to the error in the upward direction of sampling. As the differences are averaged, therefore, the errors will tend to cancel.

Note that as can be seen from FIG. 18-2 *a*), signal S4 will be zero just prior to a non-zero sample S5 and causing a small error in S5 representing input current Iin. As the scan returns upward signal S10 will be zero just prior to a non-zero sample S11 and causing a small error in signal S5 representing input current Iout. Thus the error in the difference between S5 and S6 will tend to be equal and opposite to the error in the difference between S11 and S12 and the errors in this said third pair will tend to cancel in any one of various well known methods of averaging differential current measurements before taking corrective action. Further study of FIG. 18-2 will show that said first, second and fourth pairs of samples of signals representing Iin and Iout will also tend to cancel. This inventive method of digital sample sequencing will therefore provide accurate measurement of signal Iin and Iout differentials representing fault conditions requiring corrective action.

Note that a computational time can be introduced between samples S16 and S17 and in general between any succeeding groups of 16 samples without disturbing the inventive cancellation of ADC errors. Such a computation may be required, for example, to further distinguish a true fault from other transient phenomena.

The following is a detailed description of the synchronous measurement sub-program, shown in FIG. 17, for signal differentials. In this example, a numbers of program steps operate in sequence forming an operating loops PL21 (90) and PL22 (91) of FIG. 17. The methods shown which determine when to issue a control command such as a circuit breaker trip command are typical of those known in the state of the art.

Program step 1 performs the following:

Conform the ADC 2 to continuously scan inputs A0, A1, A2, and A3 into registers R1 through R4, (See FIGS. 1, 2.)

Read result register R1, thereby sampling signal T1-1, (See FIG. 18-1, this is digital sample S1.)

Store S1,

Exit to program step 2,

Program step 2 performs the following: Read result register R2, thereby sampling signal T2-1 (sample S2), Compute ▲I=S1–S2, Using a recursive smoothing equation, compute ▲Iave= (((d–1)*▲Iave)+▲I)/d, where d is chosen to give a desired amount of smoothing, Is ▲Iave>trip? if so output trip command, Exit to program step 3, Program step 3 performs the following:

Read result register R3, thereby sampling signal T1-2 (sample S3),

Store S3,

Exit to program step 4,

Program step 4 performs the following:

Read result register R4, thereby sampling signal T3-2 (sample S4),

Compute ▲I=S3–S4,

Compute ▲Iave=(((d–1)*▲Iave)+▲I)/d.

Is ▲Iave>trip? if so output a trip command,

Exit to program step 5.

Program step 5 performs the following:

Conform the ADC 2 to continuously scan inputs A4, A5, A6 and A7 into registers R1 through R4, Read result register R1, thereby sampling signal T2-1 (sample S5), Store S5, Exit to program step 6, Program step 6 performs the following:

Read result register R2, thereby sampling signal T4-1 (sample S6),

Compute ▲I'=S5–S6,

Compute ▲Iave'=(((d–1)*▲Iave')+▲I')/d,

Is ▲Iave'>trip? if so output a trip command,

Exit to program step 7,

Program step 7 performs the following:

Read result register R3, thereby sampling signal T2-2 (sample S7),

Store S7,

Exit to program step 8.

Program step 8 performs the following:

Read result register R4, thereby sampling signal T4-2 (sample S8),

Compute ▲I'=S7–S8,

Compute ▲I'ave=(((d–1)*▲I'ave)+▲I')/d,

Is ▲I'ave>trip? if so output a trip command,

Exit to program step 9,

Read result register R4, thereby sampling signal T4-2 (sample S9),

Store S9,

Exit to program step 10,

Program step 10 performs the following:

Read result register R3, thereby sampling signal T2-2 (sample S10),

Compute ▲I'=S9–S10,

Compute ▲Iave'=(((d–1)*▲Iave')+▲I')/d,

Is ▲Iave'>trip? if so output a trip command,

Exit to program step 11,

Program step 11 performs the following:

Read result register R2, thereby sampling signal T4-1, (sample S11),

Store S11,

Exit to program step 12,

Program step 12 performs the following:

Read result register R1, thereby sampling signal T2-1 (sample S12),

Compute ▲I'=S11–S12,

Compute ▲Iave'=(((d–1)*▲Iave')+▲I')/d,

Is ▲Iave'>trip? if so output a trip command,

Exit to program step 13,

Program step 13 performs the following:

Conform the ADC 2 to continuously scan inputs A0, A1, A2 and A3 into registers R1 through R4, After four tiks, read result register R4, thereby sampling signal T3-2, (sample S13), Store S13, Exit to program step 14, Program step 14 performs the following:

Read result register R3, thereby sampling signal T1-2 (sample 14),

Compute ▲I=S13–S14,

Compute ▲Iave=(((d–1)*▲Iave)+▲I)/d,

Is ▲Iave>trip? if so output a trip command,

Exit to program step 15,

Program step 15 performs the following:

Sample result register R2, thereby sampling signal T3-1,

Store S15,

Exit to program step 16,

Program step 16 performs the following:

Sample result register R1, thereby sampling signal T1-1 (sample S16),

Compute ▲I=S15–S16),

Compute ▲Iave=(((d–1)*▲Iave)+▲I)/d,

Is ▲Iave>trip? if so output a trip command,

Completing program loop PL21 shown in FIG. 17, exit to program step PS21.

As mentioned above and further referring to FIG. 17, PL21 may include computation as required, for example, to further distinguish a true fault from other transient phenomena. Program step PL21 enters program loop PL22 which selectively may be a duplicate of program loop PL21. In turn program step PL22 may be a duplicate of program step PL21 and the total program may be an alternation between PL21 and PL22 with computational steps PS21 and PS22 providing the alternations.

THE SYNCHRONOUS PROGRAM AS A TIMER

The foregoing section entitled: APPLICATION AS A TAPCHANGER CONTROL illustrated the use of the synchronous measurement program to measure phase angle, said phase angle measurement being a measurement of time between portions of AC signals of a known constant frequency. Likewise the foregoing section entitled: APPLICATION FOR VOLTS/HERTZ MEASUREMENT illustrated the measurement of a signal frequency by the measurement of the time between two zero crossings on a selected AC signal.

In general the inventive synchronous program can be used to measure the time from a starting point to an ending point by starting a summation at the starting point and ending said summation at the ending point. Taking advantage of the fact that each program step and each turn of a program loop requires an integral multiple of a tik, said sum is formed by having each program step add its integral number of tiks to said sum and by having each program loop add its integral number of tiks to said sum on each turn of the program loop.

In many applications, the resolution of time to the nearest tik is adequate and it is often advantageous for a program to use such an arbitrary measure of time as the tik, with conversion to more recognizable units of time, such as seconds, only when required, for example, for display purposes.

In the E/Hz illustration, a method of resolving a time measurement of signal frequency was illustrated which provided a time resolution within a tik. This improvement is particularly useful for electric power AC voltage and current signals having a predominant fundamental frequency component of said signals and where a measurement of frequency is required.

BENEFITS FROM INVENTION

There are various advantages and benefits obtained or accomplished by the present invention, including:

1) use of lower frequency, level sensitive microcontrollers having inherent rejection of high frequency electrical transients.

2) Achieving high digital sampling rates of AC signals to provide improved resolution, speed and accuracy of measurements.

3) Use of the program itself as a timing means of sufficient resolution for electric utility controls and protective relays.

4) Minimizing or avoiding the use of interrupts as a means of program simplification.

5) Use of synchronous ADC sampling as a means of program simplification.

6) Use of "one thing at a time" program philosophy to simplify and shorten the program.

7) Making the program easy to write in machine language, easy to debug, easy to reconfigure from a library of subroutines from one product design to the next.

8) An important result is a very powerful program residing in on-board ROM space; for example in the 12 kilobytes such as provided by the Motorola 68HC11E9 microcontroller.

While the invention has been particularly shown and described with reference to a preferred embodiment thereof, it will be understood by those skilled in the art that various changes in form and details may be made therein without departing from the spirit and scope of the invention. Note that the three examples of synchronous operation together with other information contained in the foregoing specifications disclose representative techniques required to provide direction and information necessary to obtain operational synchronous programs for other applications.

I claim:

1. In an electronic device including an analog to digital converter (ADC) having result registers and a central processor unit (CPU), the method consisting of the steps of:

a) providing a CPU program consisting of steps and loops, b) operating said ADC and CPU synchronously, c) continuously producing digital samples of analog signals every "t" cycles, d) storing said samples in said result registers, e) updating at least one of said result registers with new digital samples every "r" clock cycles, and f) reading said result registers integral multiples of "r'" clock cycles after said result registers are updated, wherein "r'" is not greater than "r", g) providing an ADC controller having continuous scan control bits, result register control bits, and input channel select bits, h) selecting analog signals by setting said input channel select bits, i) setting said continuous scan control bits to obtain ADC conversions in a continuous round robin fashion, j) directing digital samples to selected ones of said result registers by selection of said result register control bits, for sampling a selected analog signal on integral multiples of "t" clock cycles, k) adding do-nothing operations as required to make the run time for each step and each loop of said CPU program an integral multiple of "t" clock cycles, and l) obtaining samples of said selected analog signal by reading a selected result register during said steps and said loops thereby maximizing the sampling rate of the selected analog signal and whereby said ADC and CPU programs operate synchronously to obtain digital samples of said analog signals.

2. A method as in claim 1 further including the steps of:

a) coupling analog signals which are AC signals to said ADC, b) suppressing the negative half cycles of said AC signals, c) processing digital samples of said AC signals as they are read in accordance with a synchronous measurement sub-program so as to make a partial computation of parameters of said AC signals, and d) further processing said samples in accordance with a computation sub-program to obtain parameters for desired operation of said electronic device, e) operating said synchronous measurement sub-program and said computation sub-program alternatively until said parameters indicate that said electronic device is required to provide control and protective outputs, f) branching by said computation sub-program to an output sub-program when said requirement occurs, and g) otherwise continuing said alternative operation.

3. A method as in claim 2 further including the steps of:

a) providing a microcontroller unit (MCU) having an asynchronous serial communications interface (SCI) including an address register, b) reading the SCI address register only during each operation of said computations sub-program, c) providing program branching in response to said reading, and d) sending and receiving serial data in short bursts wherein the portion of time taken by said device for communications is minimized.

4. A method as in claim 3 further including the steps of:

a) connecting said SCI of at least one said MCU to communicate with a computer functioning as a network interface module (NIM), b) connecting said computer to a local area network (LAN), c) providing common protocol requirements for said computer and said LAN, d) programming said computer to providing man machine interfaces for said devices, e) programming said computer to hand over the man machine functions for said devices to the LAN system when requested by said LAN system, f) programming said computer to interrogate and obtain parameters and data from said devices, and g) providing data and parameters obtainable from said devices to the LAN system when requested by said LAN system.

5. A method as in claim 2 further including the steps of:

a) providing an analog signal input representing an AC voltage E (signal E), b) setting said result register control bits to perform consecutive conversions on the single channel specified by said input channel select bits, c) providing a program step PS0, which is the exit statement of a previous synchronous measurement sub-program and the entrance statement for a subsequent computation sub-program and performing the following d) switching said signal E into said ADC, e) starting a program loop PL1, f) reading samples of said registers in round robin fashion, g) looking for a sample of signal E with the value of zero, h) looking for a non-zero sample of signal E, i) exiting to a subsequent program step PS1 after obtaining the first non-zero sample of signal E, j) computing the square of the first sample of signal E and forming the sum of squares, k) exiting to a subsequent program loop PL2, l) taking samples of said registers in round robin fashion, m) continuing summing the squares of the samples of signal E, n) looking for a sample of signal E with the value zero and branching to said computation sub-program when zero is sensed, o) using the results of the summation of squares in said computation sub-program to provide control parameters for said electronic devices, and whereby control parameters are provided to operate electrical equipment responsive to the magnitude of voltage E.

6. A method as in claim 5 wherein steps j) and m) consist of using the sum of samples method in lieu of the sum of the square of samples method for computation.

7. A method as in claim 5 further including the steps of:

a) providing analog signals input representing AC currents, b) reading said result registers every integral multiple of "t" cycles to provide digital samples of said current signals, c) calculating sums of said integral multiples as each digital sample is taken, starting with the first zero to non-zero transition (znz) in the value of said digital samples of said signal E and ending with each succeeding znz and non-zero to zero (nzz) transition of said current signals, d) switching signals representing currents, one at a time, into said ADC, e) finding znz for each current signal, f) reading ADC result registers, g) forming the sum of squares of non-zero samples until a zero sample is read, h) exiting to said computations sub program after the last current signal has been switched to the ADC, and i) using said sums of integral multiples of said ADC conversion cycles "t" to compute the phase angle from voltage signal E to each current signal whereby said sums of squares and phase angles are provided to obtain modification of said control parameters.

8. A method as in claim 7 wherein step g) consists of using the sum of samples method in lieu of the sum of the square of samples method for computation.

9. A method as in claim 2 further including the steps of:

a) having AC voltage input signals with phase rotation in the order EA', EB', EC' from three phases of an electric power circuit, b) setting said result register control bits to perform consecutive conversions on the single channel specified by said input channel select bits, c) taking digital samples from said ADC using program loops operating in an integral "n" multiple, together with program steps operating in an integral "m" multiple, of the number of clock cycles "t" required for an analog to digital conversion, d) selecting said AC input signal EA', e) finding a zero to non-zero (znz) transition in said digital samples, f) starting a sum "N" of "n" and "m", g) recording the first non-zero sample of said AC signal EA' as "a", h) finding and recording a peak voltage factor EA for said signal EA', i) finding a non-zero to zero (nzz) transition in said digital samples, j) replacing said signal EA' with said signal EC', k) finding and recording a peak voltage factor EC for said signal EC', l) finding a nzz transition in said digital samples, m) replacing said signal EC' with said signal EB', n) finding and recording a peak voltage factor EB for said signal EB', o) finding a nzz transition in said digital samples, p) replacing said signal EB' with said signal EA', q) finding the first znz transition in said digital signals, r) recording the first non-zero signal as "a'", s) recording the sum "N", t) determining Emax as the largest of EA, EB, EC, u) determining E/Hz in time units of one clock cycle from the relation:

$$E/Hz = Emax*(N-1)*t*(1*(a-a')/(4\pi*EA))$$

v) selectively determining E/Hz in time units of seconds by multiplying by the length of one clock cycle in seconds thereby obtaining E/Hz parameters for use in said electronic devices to provide outputs for controlling and protecting electrical apparatus.

10. A method as in claim 9 further including the steps of:

a) finding the geometric mean of the frequencies in the frequency range of said E/Hz device, b) providing a first and a second set of scaling resisters from each of three said input voltage signal sources to provide six inputs to said ADC, c) selecting ADC inputs provided by said first set of scaling resisters when a frequency below said geometric mean frequency is detected, d) selecting ADC inputs provided by said second set of scaling resisters when a frequency above said geometric mean frequency is detected, e) selecting said scaling resisters such that expected magnitudes of voltages will not saturate said ADC over the frequency range of said E/Hz device whereby said E/Hz device will operate over a wide range of frequency.

11. A method as in claim 10 further including the step of determining the period P of said AC signal EA' in time units of one clock cycle using the equation:

$$P=(N-1)*t*(1+(a-a')/(2\pi*EA))$$

thereby obtaining frequency parameters for use in selecting said scaling resisters.

12. A method as in claim 1 further including the steps of:

a) providing first and second AC signals of a first polarity respectively representing input and output currents of an electrical equipment, b) providing third and fourth AC signals respectively representing said input and output currents with polarities reversed, c) providing fifth and sixth AC signals respectively representing said input and output currents of first polarity, d) providing seventh and eighth AC signals respectively representing said input and output currents with polarities reversed, e) scaling said first, second, third, and fourth AC signals for linear ADC operation over a first range of current magnitudes, f) scaling said fifth, sixth, seventh and eighth AC signals for linear ADC operation over a second range of current magnitudes, g) arranging inputs into four pairs of signals comprising said first and second signals, said third and fourth signals, said fifth and sixth signals, and said seventh and eighth signals, h) taking continuous periodic digital samples of said input signals, alternating between ascending order of said first to eighth signal numbers, and descending order of said first to eighth signal numbers, i) comparing samples of each said pair when taken in ascending order with samples of each said pair when taken in descending order, j) averaging at least the last two differences of each of said four pairs of samples, whereby errors developed by said ADC when said digital samples are taken in ascending order are averaged and compensated for by taking the samples in descending order, k) using said average differences to obtain parameters for providing corrective outputs of said electronic device such as for tripping a circuit breaker.

13. A method as in claim 12 further comprising the steps of:

a) providing said input current signals from auxiliary current transformers having center tapped secondaries, b) each said auxiliary current transformer providing said signals of opposite polarity from each other, c) providing a first pair of auxiliary transformers for said input current, d) providing a second pair of auxiliary transformers for said output current, e) the first of each of said pairs of transformers being linear over the range of expected current magnitudes, f) the second of each of said pairs saturating above the current magnitude from normal load currents, g) obtaining said first, second, third, and fourth said AC signals from said first auxiliary transformers of said pairs of transformers, h) obtaining said fifth, sixth, seventh, and eighth said AC signals from said second auxiliary transformers of said pairs of transformers, whereby the second of each pair of transformers provides linear operation of said electronic device above a level where the first transformer of the pair saturates.

14. In an electronic device including a central processor unit (CPU) operating at a constant clock frequency, the method comprising the steps of:

a) providing a program for said CPU consisting of program steps and program loops each operating in an integral multiple of a number of clock cycles, "t", b) summing said integral for each said step and each turn of said loop starting said sum at a first selected time and ending said sum at a second selected time, c) providing an analog to digital converter (ADC) for converting AC signals to digital samples, said ADC having an analog to digital conversion time equal to "t", d) reading digital samples at a first AC signal from said ADC with said program steps and said program loops operating synchronously with analog to digital conversions of said ADC, e) selecting a change in polarity of said first AC signal as said starting time, f) selecting the same change in polarity of a later cycle of said first AC signal as the ending point whereby said sum is a measure of the frequency of said AC signal.

15. A method as in claim 14 wherein step f) consists of:

a) selecting the same change in polarity of a cycle of a second AC signal having the same frequency as the said first AC signal as the ending point whereby said sum becomes a measure of the phase angle from said first signal to said second signal.

16. A method as in claim 14 further consisting of the steps of:

a) providing an AC signal input to said ADC having the digital samples of the negative half cycles of said AC signal input suppressed to zero, b) taking digital samples of said AC signal input from said ADC using program loops operating in an integral "n" multiple, together with program steps operating in an integral "m" multiple, of the number of clock cycles "t" required for an analog to digital conversion, c) taking the first non-zero digital sample "a" following a sample whose value is zero of said AC signal as said starting point, d) finding the peak value "EA" of said AC signal input, e) taking a subsequent second non-zero digital sample "a'" following a sample whose value is zero of said AC signal input, "R" cycles later than the cycle when said sample "a" was taken, as said ending point, f) forming a sum "N" of "n" and "m" from said starting point to said ending point, g) determining the period P of said AC signal input for R cycles of said AC signal input in time units of one clock cycle using the equation:

$$P=(N-1)*t*(1+((a-a')/2\pi*EA))$$

and h) selectively determining the period P for one cycle of said AC signal input in time units of one clock cycle by dividing P by R thereby obtaining frequency parameters for use in said electronic device.

17. Apparatus for digitizing alternating current (AC) signals, each AC signal coming from a first and second signal terminal with the potential of said first terminal being the ground reference for said signal and with the signal potential of said second terminal alternating about said reference potential comprising, in combination, a) clocking means providing clock cycles, b) analog-to-digital converter means (ADC) operable by said clocking means and having a conversion period equal to a predetermined number "t" of clock cycles, said ADC having at least one analog input, having a low and a high reference voltage input and having a range of operation starting with zero for an analog input equal to said low reference input voltage, c) processor means also operable by said clocking means, d) multiple result register means for storing digital samples converted by said ADC, e) said processor means running said ADC in a continuously scanning mode with conversions of the data of any selected analog input in a round robin fashion for storing in said multiple result registers wherein digital samples of each said AC signal are updated in integral numbers of clock cycles, f) means for connecting a high ADC reference voltage means to said high reference input, g) each of said second signal terminal being connected to a selected ADC analog input resulting in signals on said second terminals having a selected polarity which is the same as the polarity of said ADC high voltage reference, h) said ADC having said low reference input connected to a ground reference terminal to set the change of signal polarity to said ADC zero, i) said processor means containing programming steps which selectively repeat with said programming steps operating in integral multiples "m" of said "t" clock cycles and said programming steps operating synchronously with said continuous scanning mode of said ADC, j) said ADC providing periodic non-zero digital samples proportional to said AC signals whenever the polarity of said AC signal is the same as said high reference voltage and providing digital samples which are zero whenever said AC signals are not of the selected polarity, and k) means for processing said non-zero digital samples to make measurements to obtain parameters of said AC signals.

18. Apparatus for controlling and protecting electric power apparatus in response to measurement of volts per hertz in alternating current (AC) signals, three said AC signals being of the same frequency and representing the three phases voltages of a three phase circuit, comprising, each signal coming from a pair of terminals with the potential of one terminal being the ground reference for said signal and with the signal potential of the second terminal alternating about said reference potential, said apparatus comprising in combination, a) means for providing clock cycles, b) a central processing unit (CPU) means operable by said clock cycles, c) an analog-to-digital converter means (ADC) operable by said clock cycles and having a conversion period equal to a predetermined number "t" of clock cycles, said ADC having at least one analog input, having a low and a high reference voltage input and having a range of operation starting with zero for an analog input equal to said low reference input voltage, d) means for connecting said three AC signals to said ADC means, e) means for setting said ADC to perform consecutive conversions on said three signals, f) means for connecting a high ADC reference voltage means to said high voltage reference input, g) means for connecting said ADC low reference input to each said AC signal ground reference terminal to set the change of signal polarity to ADC zero, h) said processor means operating said ADC in a continuously scanning mode to sequentially convert a selected one of said three AC signals into digital data and store said data in a round-robin fashion into multiple result registers, i) said processor means containing programming means consisting of steps which selectively repeat and with said programming steps operating in integral "m" multiples of "t" clock cycles to thereby operate synchronously with the continuous scanning mode of said ADC, j) said ADC means providing periodic non-zero digital samples proportional to said selected AC signals whenever the polarity of said selected AC signal is the same as said high reference voltage and providing digital samples which are zero whenever said AC signal is not of the selected polarity, and i) said processor means receiving and processing said digital samples to selectively determine the maximum amplitude among the three phase voltages, to enable determination of said AC signal frequency and said volts per hertz from which desired control and protection output signals may be obtained.

19. Apparatus for measuring, controlling and protecting electric power equipment in response to measurement of frequency comprising, in combination, a) means for digitizing at least one alternating current (AC) signal, each said signal coming from a first and second terminal with the potential of said first terminal being the ground reference for said signal and with the signal potential of said second terminal alternating about said reference potential, b) a clocking means providing clocking cycles, c) an analog-to-digital converter means (ADC) operable by said clocking means, having at least one analog input, having a low and a high voltage reference input and having a range of operation starting with zero for an analog input equal to said low reference input voltage, d) a processor means operably responsive to said clocking means, e) multiple result register means for storing conversions of said ADC, f) said processor means operating said ADC in a continuously scanning mode with conversions of the data on any selected analog input in a round-robin fashion for storing in said multiple result registers wherein AC signals are updated on integral multiples of said conversion time of "t" clock cycles, g) means for providing a high ADC reference voltage to said ADC high voltage reference input, h) means for connecting at least one of said second AC signal terminal to a selected ADC analog input resulting in the signals on said associated second terminal having a selected polarity which is the same as the polarity of said ADC high reference voltage, i) said ADC means having said low voltage reference input connected to each said AC signal ground terminal to set a change of signal polarity to said ADC zero, j) said processor containing programming means consisting of steps which selectively repeat and with said programming steps operating in integral multiples of "t" clock cycles thereby forming a programming which operates synchronously with said continuous scanning mode of said ADC, k) said ADC means providing periodic non-zero digital samples proportional to said AC signals whenever the polarity of said AC signal is the same as said high reference voltage and providing zeros whenever said AC signal is not of the selected polarity, l) said processor means receiving and processing said digital samples to determine the approximate frequency from the time difference between changes from zero to non-zero samples at the start of two selected half cycles of said selected polarity, m) means for determining the maximum amplitude of each said selected half cycle, and n) means for processing the first non-zero sample of each said selected half cycle together with said maximum amplitudes of said selected half cycle to enhance the accuracy of the measurement of frequency of said AC signal.

20. Apparatus for digitizing alternating current (AC) signals comprising, in combination, a) auxiliary transformer means with a center tapped secondary winding having a center tap terminal and with a first and a second terminal providing first and second signals of opposite polarity each of said first and second signals representing said AC signal and with the potential of said center tap terminal being the ground reference for said signal and with the signal potential of the first and the second terminal alternating about said reference potential, b) said auxiliary current transformer means having a primary winding coupled to receive one AC signal, c) analog-to-digital converter means (ADC) having at least one analog input representing said AC signal having a low and a high reference voltage input and having a range of operation starting with zero for an analog input equal to said low reference input voltage, d) a high ADC reference voltage connected to said high reference input, e) each said first and second terminals being connected to said ADC analog inputs resulting in signals on said first and second terminals having selected polarities which are the same as the polarity of said ADC high reference voltage, f) said ADC having said low reference input connected to each said AC signal center tap terminal to set the change of signal polarities to said ADC zero, g) said ADC providing periodic non-zero digital samples proportional to each said AC signal whenever the polarity of said AC signal is the same as said high reference voltage and providing zeros whenever said AC signal is not of the selected polarity, and h) means for receiving and processing said digital samples to make a desired measurement of said signals using only samples proportional to the selected polarity whereby each entire AC signal is digitized and zero crossings identified.

21. In an electronic device including an analog to digital converter (ADC) and a central processor unit (CPU) having a common clock, said ADC having result registers, ADC controller scan control bits, result register control bits, and analog channel select bits, the method comprising the steps of:

a) selecting analog signals by setting said analog channel select bits, b) setting said scan control bits to obtain ADC conversions in a continuous round robin fashion, c) taking digital samples from said ADC using program loops operating in an integral "n" multiple, together with program steps operating in an integral "m" multiple, of the number of clock cycles "t" required for an analog to digital conversion, and d) summing said integral for each said step and each turn of said loop starting said sum at a first selected time and ending said sum at a second selected time whereby said sum becomes a measure of the time interval from said starting time to said ending time.

* * * * *